United States Patent [19]

Leger

[11] Patent Number: 5,446,765
[45] Date of Patent: Aug. 29, 1995

[54] APPARATUS FOR RECOVERING DATA AND CLOCK INFORMATION FROM AN ENCODED SERIAL DATA STREAM

[75] Inventor: Geary L. Leger, Fremont, Calif.
[73] Assignee: Cirrus Logic, Inc., Fremont, Calif.
[21] Appl. No.: 292,629
[22] Filed: Aug. 17, 1994

Related U.S. Application Data

[62] Division of Ser. No. 979,573, Nov. 19, 1992.
[51] Int. Cl.[6] .............................................. H04L 7/02
[52] U.S. Cl. .................................... 375/359; 341/70; 341/71; 371/37.4; 375/282
[58] Field of Search ................. 375/55, 75, 80, 83, 375/87, 110, 56, 60, 84; 341/68, 70, 71; 371/37.4; 307/269, 601, 602; 328/55, 63; 327/141, 161, 261, 291

[56] References Cited

U.S. PATENT DOCUMENTS 5,172,397  12/1992  Llewellyn ........................... 375/110
5,303,265  4/1994  McLean .............................. 375/110

Primary Examiner—Stephen Chin
Assistant Examiner—Amanda T. Le
Attorney, Agent, or Firm—William E. Alford; Steven A. Shaw

[57] ABSTRACT

The invention doubles the bit rate for a given media bandwidth as compared to, for example, Manchester encoding. It is applicable to serial transmission or storage of digital data. An arbitrary NRZ data stream is first encoded by a pre-encoding method, such as Manchester, that combines clock and data to represent a single NRZ bit in one clock cycle. A toggle flip flop then re-encodes the pre-encoded waveform, thus generating a double toggle (DT) encoded waveform, which spreads the spectral energy over a larger bandwidth and encodes two NRZ data bits within one transmission clock cycle. In the case of Manchester pre-encoding, data is decoded by determining if there are transitions nearly synchronous with an edge of the recovered clock. For other pre-encoding methods, decoded data is determined by the length of the transition period and the edge polarity of the recovered clock at the leading edge of the transition within the DT encoded waveform. DC offset is reduced by substitution within and inversion of the DT encoded waveform. DC offset compensation of the encoded waveform is either removed prior to data decoding or after a data pre-decoding step; in either case the apparatus searches and detects predetermined substituted patterns in order to correct for the inversion or substitution. Further, a clock state generator is disclosed that uses precision silicon delays in order to generate clock states and quickly synchronize the states to the received encoded waveform. The clock states generate the recovered clocks required to decode data from the encoded waveform.

17 Claims, 29 Drawing Sheets

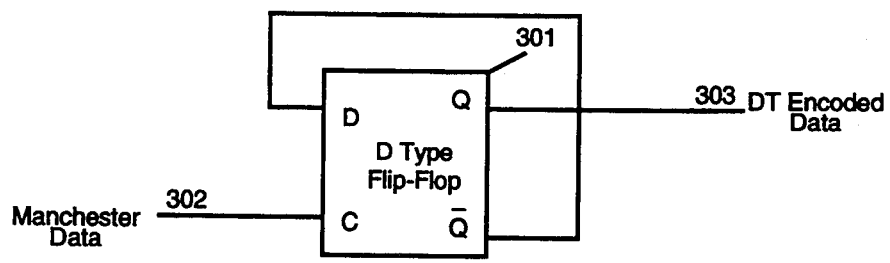
FIG. 3
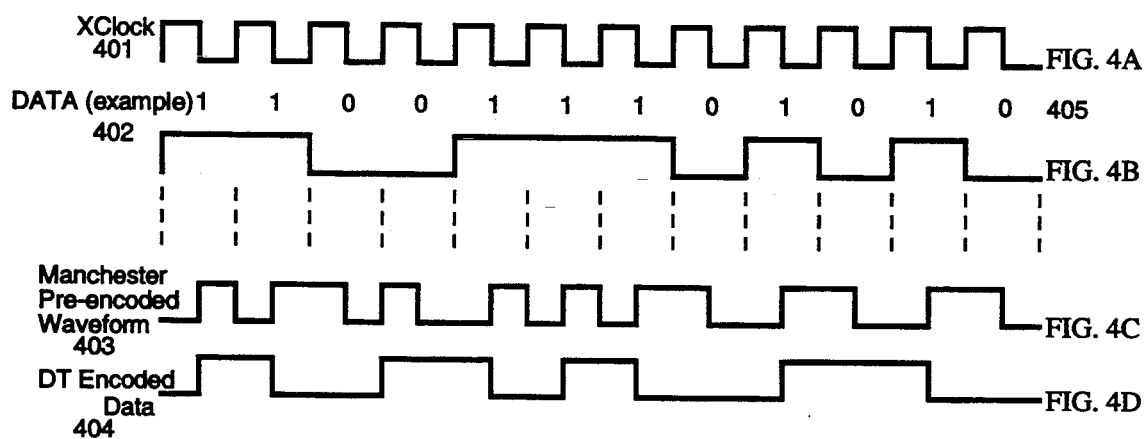

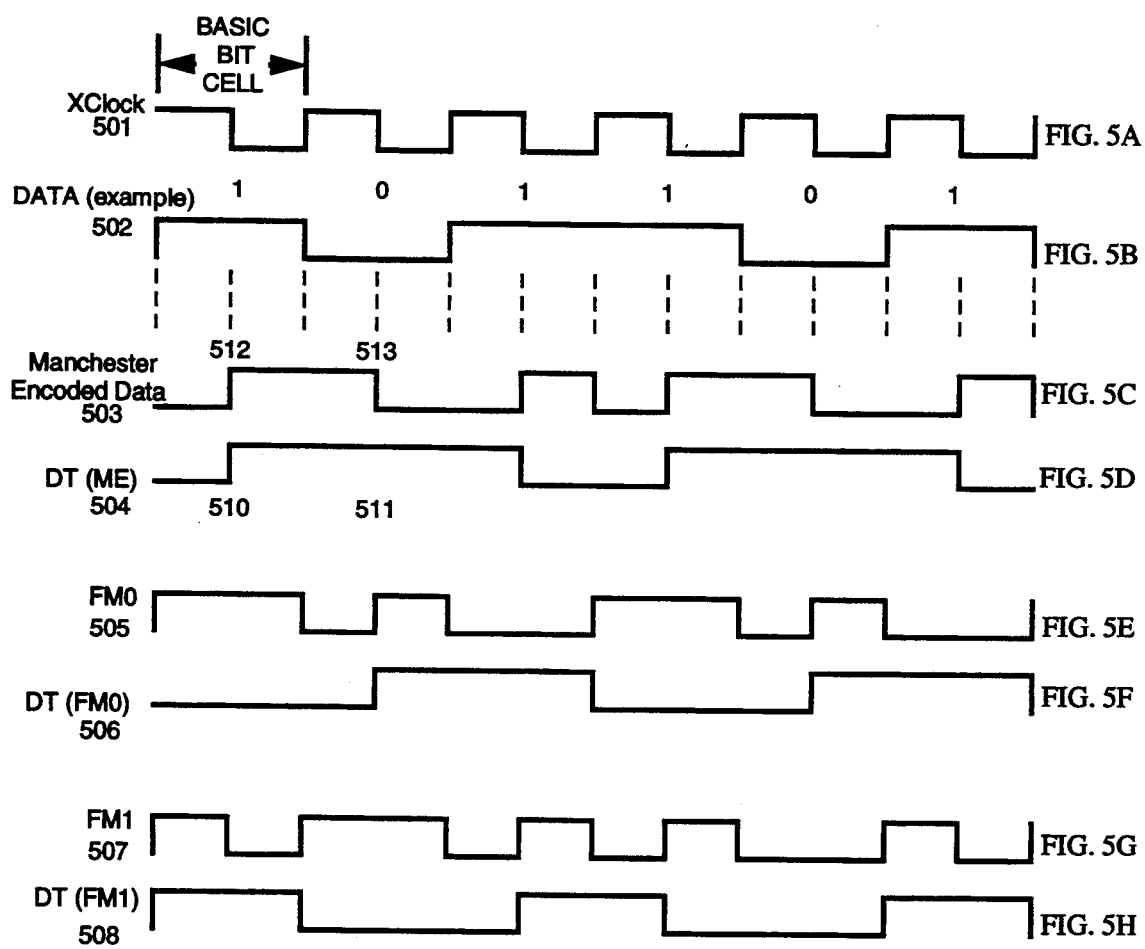

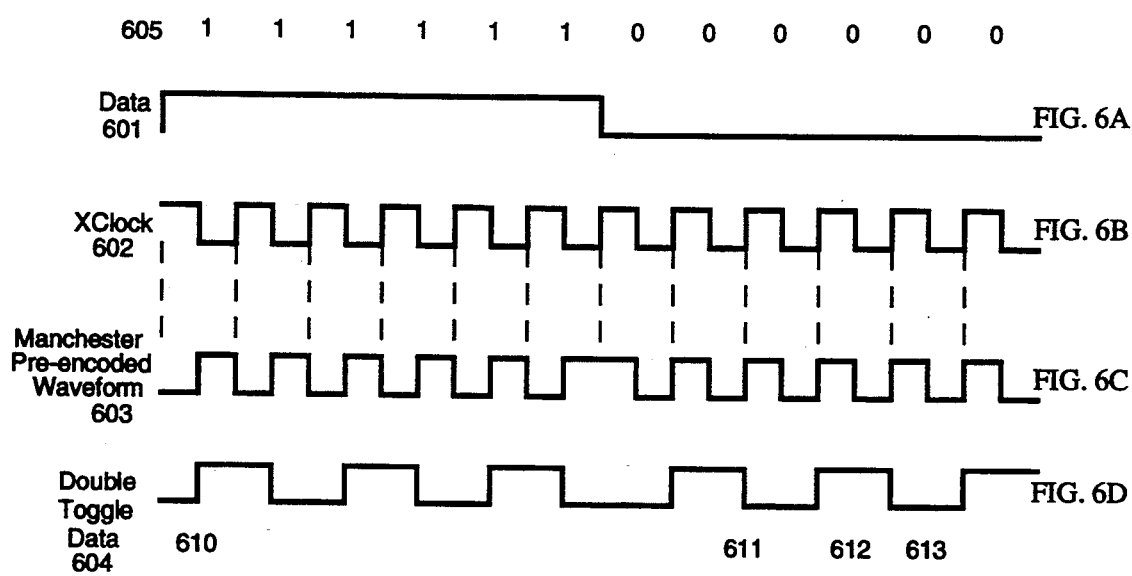

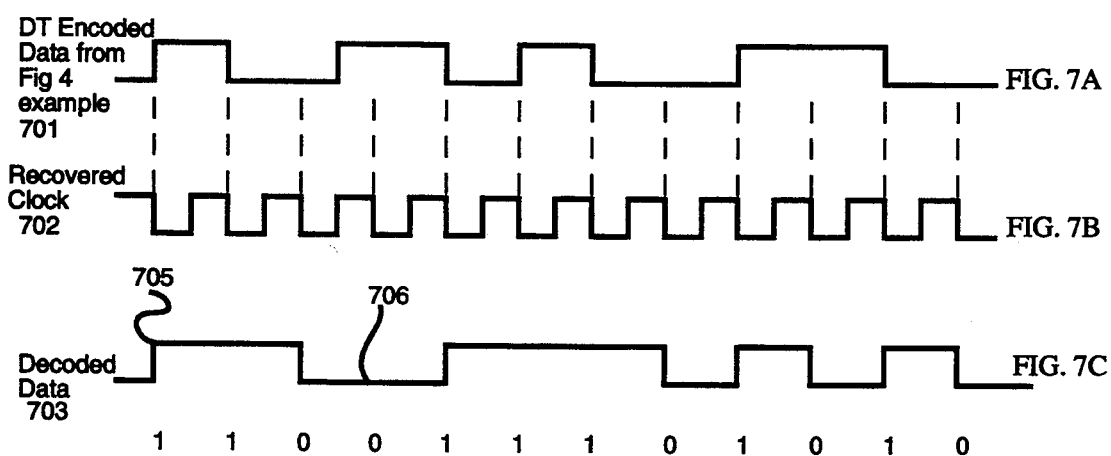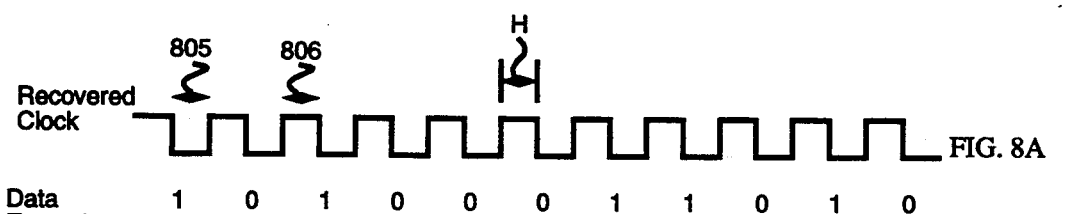

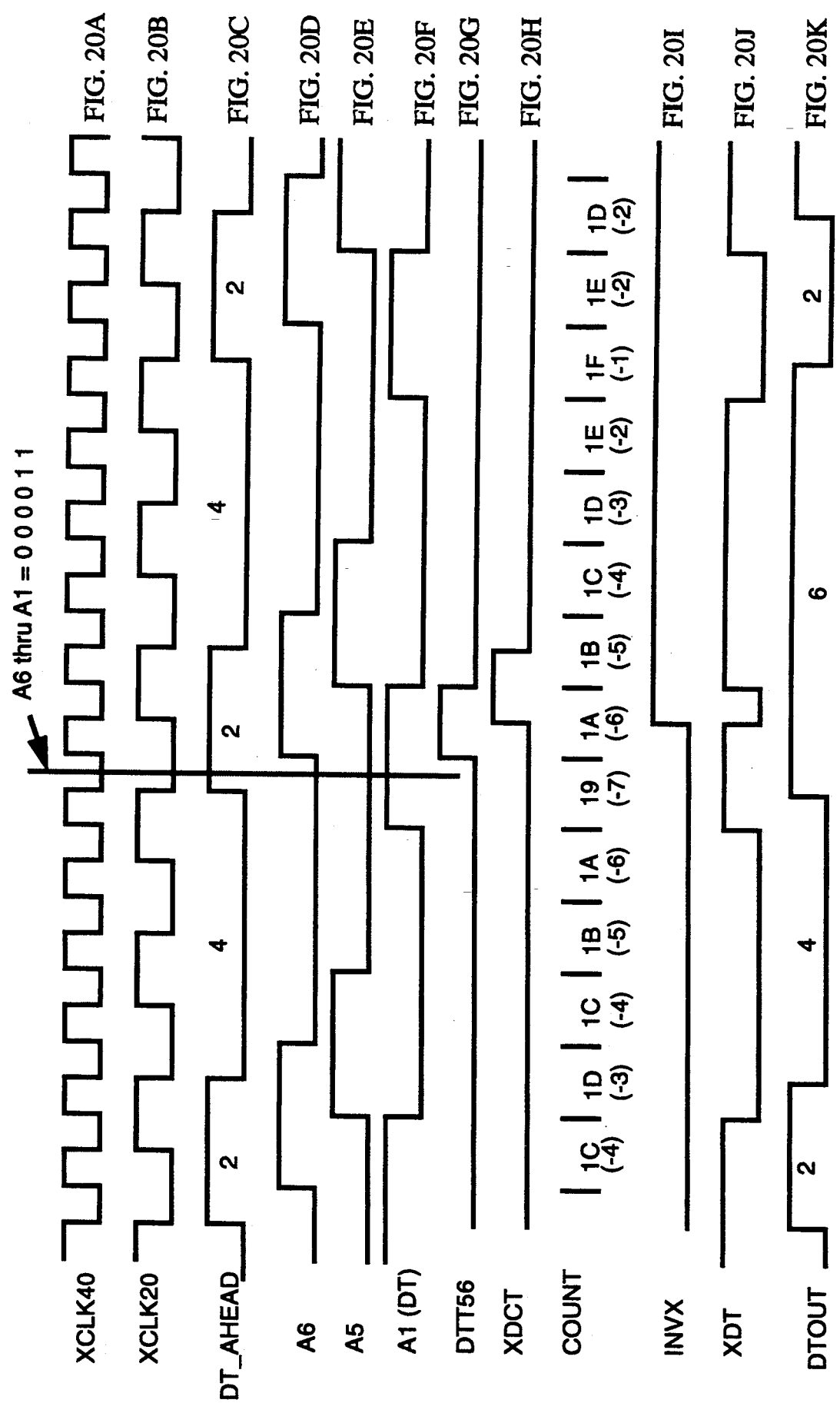

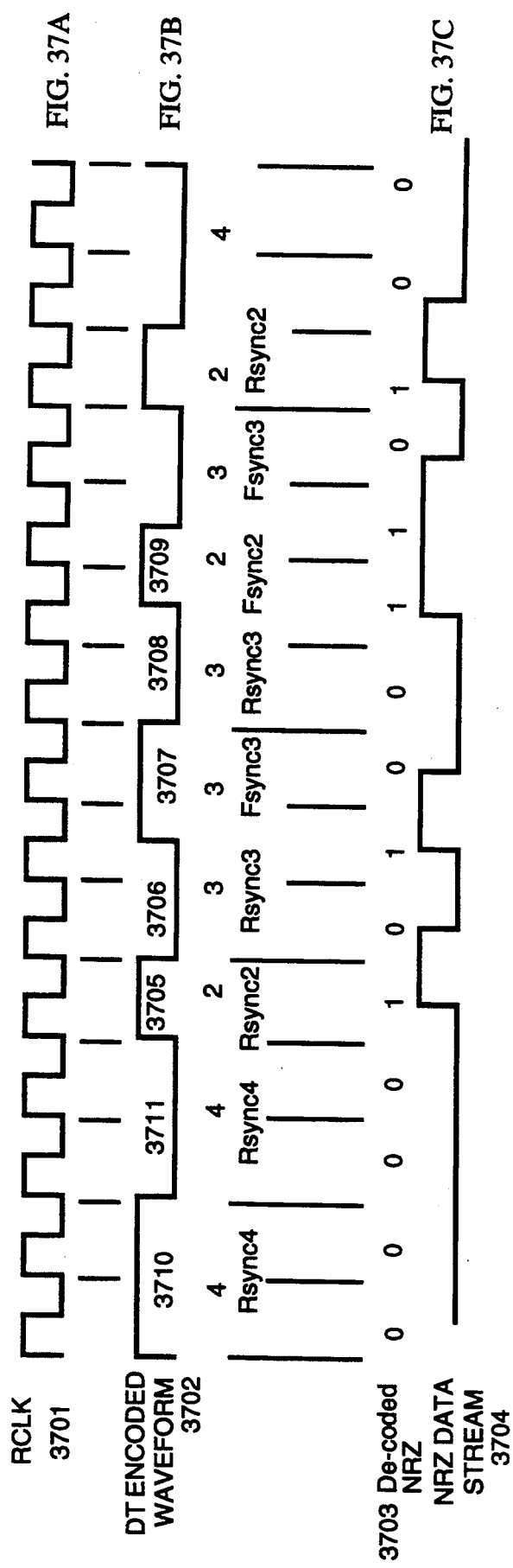

APPARATUS FOR RECOVERING DATA AND CLOCK INFORMATION FROM AN ENCODED SERIAL DATA STREAM

This patent application is a divisional of U.S. patent application Ser. No. 07/979,573 filed on Nov. 19, 1992 entitled "Bit Rate Doubler for Serial Data Transmission or Storage" by Geary L. LEGER now pending before the U.S. Patent and Trademark Office.

FIELD OF THE INVENTION

The invention encodes and decodes digital signals for use in applications such as data storage/retrieval and serial data communication. The invention's preferred embodiment is targeted for use in Local Area Networks, which allow digital computing devices and peripherals to communicate with one another over serial communication lines. The invention performs clock recovery from the serial signal and DC offset compensation within the serial signal.

BACKGROUND OF THE INVENTION

Presently IEEE 802.3 local area networks, also known as Ethernets, utilizing unshielded twisted pair (UTP) wires or coaxial transmission lines, are limited by specifications to a maximum transmission frequency of 10 megahertz (MHz). This corresponds to a bit rate of 10 megabits per second (MBPS). Because existing UTP cabling for IEEE 802.3 has a specified maximum bandwidth of 10 MHz and the IEEE 802.3 encoding provides a corresponding bit rate of only 10 MBPS, if one desires to double the bit rate for the existing bandwidth and transmission media, then a new method of encoding data is necessary.

FIG. 1 shows the existing method of UTP operation using an IEEE 802.3 10-BASE-T configuration. Data is converted from parallel digital data 120 into serialized non-return to zero (NRZ) digital data 121 in the Serializer 101, also known as Media Access Controller, of Station 113. A station or node may be anything connected to a LAN, such as a computer, server, router, repeater, terminal or other peripheral device (printers, modems, or fax machines). Serialized NRZ data 121 is sent to the Manchester Encoder 102 (ME). ME 102 encodes clock and data together by manipulating the phase of the clock, thus generating another serial stream of encoded data 122. Manchester is the code or encoding method selected by the IEEE 802.3 specification by which clock and data are combined to provide a self clocked serial transmission. Encoded data 122 is buffered by transformer driver 103. Transformer driver 103 drives the coupling transformer 123 such that data propagates onto the UTP wires. The encoded data is received at regenerative repeater port 114 which comprises the receiving end of this communication channel. Encoded signals are received by the receiver transformer 129 and amplified by the receiver amplifier 107 to generate encoded data. Manchester Decoder 108 (MD) recovers clock and decoded data 131 from the encoded data. The MD performs Manchester decoding which is the reverse operation of Manchester encoding. Deserializer 109 converts the decoded data 131 from serial into parallel digital information 132.

Encoding methods or codes other than Manchester have been and can be used in serial communication systems. These include Biphase-Level (also known as Biphase-L or Inverted Manchester), FM0 (also known as Biphase-Space or Biphase-S), FM1 (also known as Split-Phase-Mark or Biphase-Mark or Biphase-M), Differential Biphase-Level (also known as Differential Biphase-L), and Differential Manchester. Because of a close relationship between these codes, it is easy to confuse the definition one with that of another. For this discussion we will consider Biphase-Level to be the inverted waveform of Manchester and Differential Manchester to be the inverted waveform of Differential Biphase-Level. Definitions for some of the above encoding schemes are found in *Zilog* 1982/1983 *Data Book*, Page 180 or *Zilog Z16C30 Preliminary Product Specification*, May 1989, Page 8, as well as the discussion below. Similar to Manchester encoding, each of these prior-art single encoding methods provide a bit rate of only 10 MBPS for a given maximum serial signal bandwidth of 10 MHz. Thus, if one desires to double the bit rate for an existing bandwidth and transmission media, then a new method of encoding data is necessary.

Another problem that arises in local area networks using coupling transformers is that over a period of time a DC offset can accumulate on the transmission line. DC offset can be caused on the LAN transmission line by an unequal number of time periods of positive pulses as compared with negative pulses within the serial signal transmitted. If DC offset accumulates beyond a tolerable limit, then it can cause the receiving amplifier to operate outside of its specifications, which in turn can cause errors in the received data.

In response to this problem, the tape recording industry developed the Miller Squared Code (Jerry Miller, U.S. Pat. No. 4,027,335). This is an attempt to generate a DC free code, also referred to as a DC balanced code, that improves upon a Miller Code (Armin Miller, U.S. Pat. No. 3,108,261) by removing a transition pattern within the Miller Code for a particular NRZ bit pattern. The Miller Code is often referred to as a (MFM) modified frequency modulation code or delay modulation code which is in a category of (RLL) run length limited codes.

Manchester Encoding is immune to this problem due to the fact that over time the number of transmitted negative and positive pulses is equal, which cancels out the DC offset. However, Manchester encoding is limited to a maximum bit rate of 10 MBPS by IEEE specifications and cabling. New encoding methods, created to improve LAN system performance, must also solve the DC offset problem.

SUMMARY OF THE INVENTION

The present invention decodes data and clock information from an encoded serial signal that contains both clock and data information. Clock information is first recovered using a clock recovery system which comprises a transition detector to detect transitions in the encoded serial data streams and generate signal in response to the detection of the transition signals. To create a clock rate that is four times the baseband frequency necessary to allow half bit periods within a transition period to be counted, the present invention further comprises digital circuitry to generate four non-overlapping clock states. Precision silicon delays are used in the clock state generator circuitry to produce very precise pulses of a clock state. Precision silicon delays are also used to align the phases of clock-state-one and clock-state-three with the detected transitions of the serial encoded signal which is necessary for decoding. In the event a transition is detected too far from a clock-state-one or a clock-state-three pulse causing misalignment, flipping is performed to correct the misalignment. A flipping means flips the polarity of the recovered clock and resets the clock state generators.

With respect to data decoding, because clock and data information is encoded at points of transition, the encoded data is preliminarily decoded by determining when transitions occur within the encoded waveform. To accomplish this task, a predecoder is used in addition to the clock state generation circuitry and the transition detector discussed above. The preliminary decoded data stream along with the recovered clock information and the encoded serial signal are then provided to an offset replacement decoder to generate a non-return-to-zero (NRZ) data stream. Offset replacement decoding is accomplished by either detecting predetermined transition patterns within said encoded serial signal or by detecting a predetermined sequential number of half bit periods with no transition and correcting the preliminary data stream upon making such detection. The described offset replacement decoding apparatus supports a number of pre-encoding methods such as Manchester and Biphase-Level.

Other advantages of the present invention will become readily apparent to those skilled in the art from the following detailed description and accompanying drawings.

BRIEF DESCRIPTION OF THE DRAWINGS

FIG. 3 illustrates the basic DT encoding device, a toggled Flip-Flop.

FIGS. 4A–4D show an example of how Double Toggle (DT) encodes a waveform.

FIGS. 5A–5H show an example of DT encoding utilizing Manchester, FM0, and FM1 pre-encoding schemes.

FIGS. 6A–6D show the NRZ data pattern that generates the maximum rate of frequency for the DT encoded waveform.

FIGS. 7A–7C show the conceptual operation of the DT Decoder.

FIGS. 8A–8C illustrate the half bit transition periods referred to as 2, 3, and 4.

FIGS. 20A–20K illustrate an example of the timing relationships of the replacement encoder.

FIGS. 37A–37C illustrate the decoding of a DT encoded waveform, having an FM1 pre-encoding, into an NRZ data stream.

DETAILED DESCRIPTION OF THE PREFERRED EMBODIMENT

DT ENCODING AND DECODING METHODS

Double Toggle (DT) encoding is a method of double encoding. DT encoding re-encodes data that has been pre-encoded by prior art methods. Prior art methods combine clock and data into a waveform representing only one bit of data per basic clock cycle. The DT method encodes two bits into the basic clock period. Some prior art encoding methods that would function as the pre-encoding method for DT encoding are: Manchester, FM0 (also known as Bi-Phase Space, Biphase-Space, or Biphase-S), FM1 (also known as Split-Phase-Mark, Bi-Phase Mark, Biphase-Mark or Biphase-M), Biphase-Level (also known as Bi-Phase Level, Biphase-L or Inverted Manchester), Differential Biphase-Level (also known as Differential Bi-Phase Level or Differential Biphase-L), and Differential Manchester. These methods generate a pre-encoded waveform used in DT encoding. In the case of Manchester or the case of Biphase-Level, the DT encoded waveform is equivalent to that produced in the prior art known as a Miller code, but may be shifted half of one bit cell.

Figure 13:
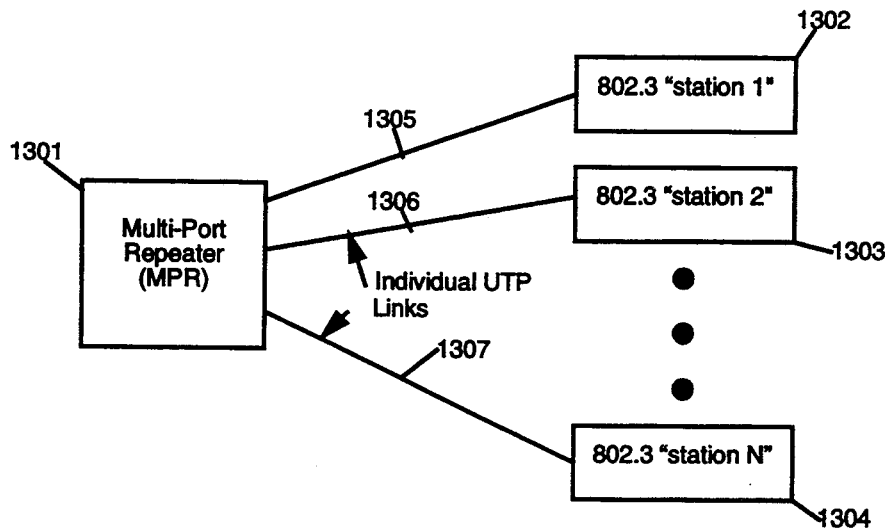
FIG. 13 illustrates a multi-port repeater topology. (IEEE 802.3 10-BASE-T).
Figure 14:
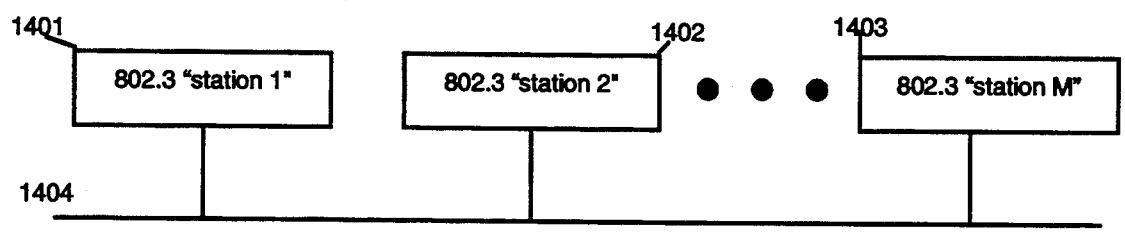
FIG. 14 illustrates a coax based topology. (IEEE 10-BASE-2 or 10-BASE-5)

DT encoding, as illustrated in FIG. 13, is envisioned operating within an IEEE 802.3 based local area network with Unshielded Twisted Pair cabling connected to one or more Multi-Port Repeaters. DT encoding, as illustrated in FIG. 14, will also operate with an IEEE 802.3 local area network using coaxial cables as the transmission media. DT encoding is described herein as operating with a system having a maximum transmission rate of 10 MHz as specified by IEEE 802.3 standards, however, the invention will operate at other specified transmission rates as well. Double Toggle encoding functions with prior art pre-encoding methods that combine clock and data in order to represent a single user data bit in one clock cycle such as those listed above. Manchester encoding is the more prevalent method that is used herein to further describe Double Toggle encoding.

FIGS. 5A-5H illustrates how some of these pre-encoding methods are utilized in Double Toggle encoding. Waveform 504 shows a Double Toggle encoded data stream that utilizes Manchester encoding as the pre-encoding means. Manchester encodes a logical one as a positive transition in the middle of the basic clock period or bit cell and a logical zero as a negative transition in the middle of the basic bit cell. Waveform 506 illustrates how the DT method encodes a data stream that utilized FM0 as the pre-encoding means. FM0 and FM1 encoding assures that a transition occurs at the bit cell boundary. FM0 encodes a logical zero as a transition In the middle of the bit cell. FM0 encodes a logical one if no transition occurs in the middle of the bit cell. Waveform 508 is an example of the results of Double Toggle encoding when FM1 is the pre-encoding means. FM1 encodes a logical one as a transition in the middle of the bit cell and encodes a logical zero as no transitions in the middle of the bit cell. Manchester encoding is specified by the IEEE 802.3 standard for LANs. Therefore in this description of the preferred embodiment of the invention, Manchester encoding is utilized as the pre-encoding means. However as can be seen from FIGS. 5A-5H, DT encoding is equally applicable to the other pre-encoding means.

FIG. 3 and FIGS. 4A-4D illustrate the basics of Double Toggle encoding. A Manchester pre-encoded waveform 403 is input into toggle flip-flop 301. The toggle flip-flop performs a divide-by-2 operation making the DT encoded data stream 404 one half the frequency of the Manchester pre-encoded waveform. The information content of the Manchester encoded data is maintained by DT encoding. Waveform 604 of FIG. 6D illustrates a reduction in waveform transitions after a Manchester pre-encoded waveform 603 is encoded by the Double Toggle method. Thus, the Double Toggle method encodes twice as much data into the same bandwidth.

However, DT encoding requires a more sophisticated decoding apparatus to recover the clock and data from the DT encoded waveform. DT encoding is more efficient in utilizing the bandwidth of the transmission system; the lower end of the spectrum increases under DT because data is encoded at lower frequency points. In a LAN connection utilizing DT encoding such as that illustrated by FIG. 2, lower frequency spectral energy may require new coupling transformers (223 and 229) as well as transformer driver 203 and receiver amplifier 207. But the upper communication layers, that are above the Physical Layer of hardware, are transparent to the DT encoding. The invention does not require changes in UTP lines or other associated Physical Layer wiring. This invention doubles the bit rate (data rate) of the previous system while maintaining the same high end bandwidth cut off of the original communication channel.

DOUBLE TOGGLE ENCODING METHOD

Manchester encoding is analogous to combining clock and data by phase shifting. If a one bit is encoded, then the manchester encoded stream 503 is 180 degrees out of phase (512) with the pulse of the transmit clock 501 (referred to as XCLK). If a zero bit is encoded, then the manchester encoded data is in phase (513).

DT encoding is analogous to encoding clock and data at points of time where the clock edge is rising or falling. For purposes of illustrating DT encoding, we use Manchester encoding as the pre-encoding means and use DT encoding on the falling edge of the clock. Data representing a logical one 510 has a transition (or change of state) in the DT output encoded waveform on the falling edge of the clock. "On the rising edge of the clock" can be defined as the moment in time that is coincident or nearly coincident with the transition of XCLK from a low to a high logic level. Conversely "on the falling edge of the clock" can be defined as the moment in time that is coincident or nearly coincident with the transition of XCLK from a high to a low logic level. Data representing a logical zero 511 in the DT output encoded waveform has no transition on the falling edge of XCLK.

In FIG. 6, consecutive logical ones are encoded into alternating transitions (610) in the output waveform on the falling edge of XCLK. Consecutive logical zeroes are encoded into alternating polarities 612 and 613 that change state on the bit cell boundaries of the XLCK period. To encode a zero, the output remains at a constant high or low level state during the entire period of XCLK, transitioning only on bit cell boundaries 611. An encoded zero does not have a transition on the falling edge of XCLK. A series of consecutive ones or consecutive zeroes, such as those in the DT waveform 604, represents the maximum transition rate for a given transmit clock (XCLK) rate or frequency.

It will be clear to one skilled in the art that the Double Toggle method of encoding is not limited to using the falling edge of a clock. The rising edge of a clock can also be used to encode data. Similarly, logical encoding can be reversed. For example, a logical zero can be encoded as a transition on the falling (or rising) edge of XCLK and a logical one can be encoded by the absence of any transition on the falling (or rising) edge of XCLK.

DOUBLE TOGGLE DECODING METHOD

A basic method of operation of the DT decoder is illustrated by the waveforms in FIGS. 7A-7C. The decoder requires a clock recovery circuit to separate the clock from a received DT encoded waveform. In the above discussion of encoding, a transition on the falling edge of XCLK was used to encode a logical one and this design choice will be used in the following discussion of decoding. FIGS. 7A-7C show that if a transition of the DT encoded waveform 701 aligns with the falling edge of a recovered clock 702, then decoder output is a logical one 705. If no transition aligns on the falling edge of the recovered clock, then a logical zero is decoded 706. While this explains the theory of DT decoding with Manchester pre-encoding, the actual operation is more complicated because of the necessary alignment between a recovered clock and the encoded waveform to properly detect transitions. DT decoding a signal that was DT encoded with a Biphase-Level pre-encoding operates similarly to decoding a signal with a Manchester pre-encoding merely requiring inversions and clock state swaps. DT decoding for FM1, FM0, Differential Manchester, and Differential Biphase-Level requires analyzing the transition periods in relation to the recovered clock. The description of the DT decoding apparatus below further explains the details of clock and data recovery.

DC OFFSET COMPENSATION

Before we can proceed with more detailed discussions concerning DC offset compensation, we first introduce the concept of 2s, 3s, and 4s (twos, threes, and fours). These are also known as transition patterns. A half bit time, represented by H, is one half of a clock cycle or bit cell, as shown by 805 or 806 in FIGS. 8A–8C. DT encoded data produces transition periods of 2H (807), 3H (808), and 4H (809) (two half bits, three half bits, and four half bits) between any two transitions. DT encoded data, that is uncompensated, never produces transition periods that are less than 2H nor greater than 4H. For reasons of brevity, transition periods will be referred to as 2, 3, or 4 (the plural form of transition periods are referred to as 2s, 3s, or 4s). Further investigation of the characteristics of the DT encoding shows that uncompensated DT encoded data never has an odd number of 3s between any two 4s.

Uncompensated DT encoding creates a waveform that could possibly create an accumulated DC offset across the coupling transformer. A waveform with varying periodicity or duty cycle input into a transformer can cause the accumulation of a DC offset. If this accumulation becomes very large it may exceed the specifications of other electronic devices, such as a differential amplifier, causing errors in the receiving end of a communication channel. A method is required to prevent an accumulation of DC offset in order to reliably receive an encoded waveform. Manchester, FM0, and FM1 encoding schemes do not create problems of an accumulating DC offset because the periodicity or duty cycle of ones and zeroes is equivalent. Therefore these encoding methods do not require offset compensation because the average net accumulated DC offset is zero.

Figure 9:
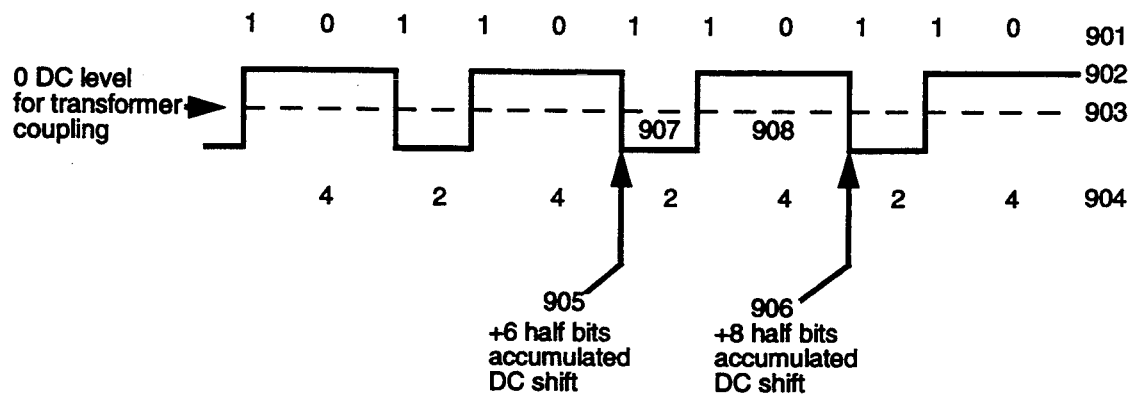
FIG. 9 illustrates a positive accumulation of DC Offset by a worst case pattern.
Figure 10:
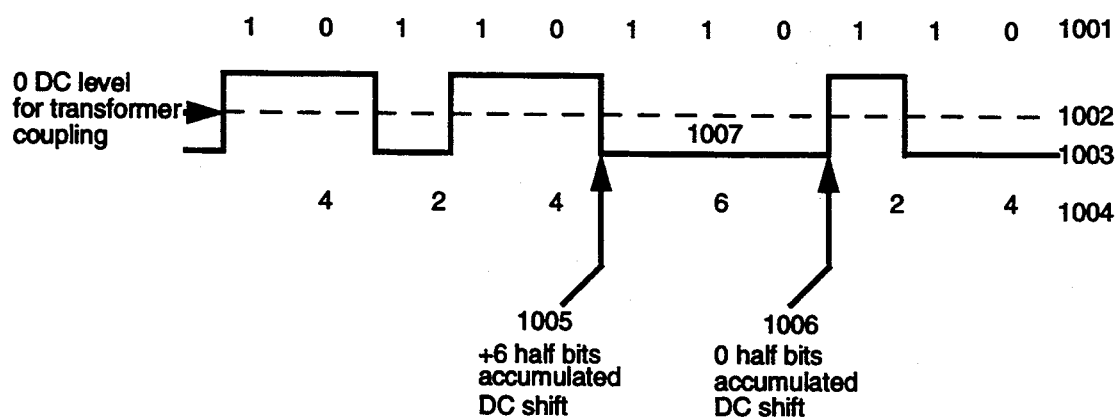
FIG. 10 illustrates the concept of eliminating DC Offset by replacing a 2-4 transition pattern by a 6.

Refer to FIG. 9 and FIG. 10. DC offset can be viewed as a net accumulation of half bit transition periods above and below a zero DC level. For example, if there is 2H below zero DC and 4H above zero DC there is a net accumulation of plus 2 half bits of DC offset. This net accumulation of a count of half bit values can be referred to as a DC offset count. The NRZ data pattern shown in FIG. 9 (1-0-1-1-0-1) will DT encode into a transition pattern of 4-2-4-2. This is a worst case pattern that illustrates the greatest amount of DC offset that can accumulate in the shortest period of time. Other transition patterns, such as -3-2-3-2, can also cause a net accumulation of DC offset.

The method described herein to prevent an accumulation of DC offset is to compensate the DT encoded output by substituting 5H and 6H transition patterns respectively for 2-3 and 2-4 transition patterns. The 2-3 and 2-4 are known as replaceable transition patterns. The 5H and 6H are known as substituted transition patterns. The first two half bits of the replaceable 2-3 transition pattern is known as the first value of the transition pattern. Transition periods of 5H and 6H can be substituted because the maximum transition period for uncompensated DT encoding is 4H. 5s and 6s are analogous to 2s, 3s, and 4s; the numeric value represents the number of half bits between transitions. However unlike 2s, 3s, and 4s, the 5s and the 6s are replacement patterns used only for the purpose of DC offset compensation. Whenever a 5 is used, it replaces a 2-3. A 5 is never substituted for a 3-2 transition pattern. A 6 is used to replace a 2-4 but never represents a 4-2 nor a 3-3 transition pattern. These definitions of 5s and 6s create an unambiguous method of compensated DT encoding and decoding. It will be clear to one skilled in the art that other patterns may also be used to compensate for an accumulation of DC offset. For example, the present use of 5 and 6 as replacement for 2-3 and 2-4 transition patterns is chosen for simplicity in the design of the encoder and decoder.

The compensated DT encoder (referred to as encoder hereafter) keeps a net count of the number of half bits of accumulated DC offset. This is illustrated by FIG. 9. When the accumulated offset reaches a specified limit, the encoder starts substituting a replacement code. Transformer coupled systems, such as IEEE 802.3 10-BASE-T local area networks, properly operate under a small amount of accumulated offset. However, if the offset is allowed to continue to accumulate without limit, then decoding errors may be introduced. A compensation method should limit the accumulated offset within a range of values. In the preferred embodiment, the target offset limit is selected as six half bits. This value, referred to as a count limit, attempts to limit the accumulated DC offset to a range from minus six to plus six half bits. The six half bit limit has been selected in order to keep the accumulated DC offset small. Six half bits is also the accumulated offset for a 4-2-4 transition pattern such as shown in FIG. 9 (905). Otherwise, the offset limit of six half bits is selected for the sake of convenience. Those of ordinary skill in the art will notice that offset compensation will function with other DC offset limits and that further research may reveal a more optimum limit.

The compensation procedure is as follows: The encoder counts the accumulated DC offset by utilizing an up/down counter. The encoder attempts to make a replacement when a comparison of the magnitude of accumulated DC offset with the count limit indicates that it reaches or exceeds the selected value of plus or minus six half bits. Transition patterns of 2-3 or 2-4, such as that shown in FIG. 9 (907 and 908) are substituted at the "next opportunity" by a 5 or 6 of "correct polarity". Those skilled in the art will recognize that a more complicated replacement method could have been selected but that this represents the preferred embodiment.

For example, assume that the encoder has counted and accumulated a DC offset of plus six or greater magnitude such as that shown in FIG. 9 (905 and 906). The encoder looks ahead and searches the DT encoded bit stream to detect a 2-3 or 2-4 transition pattern of "correct polarity" such as the 2-4 pattern of 907 and 908. A transition pattern of "correct polarity" is a pattern that after being replaced will reduce the offset value. The encoder, after recognizing that 907 and 908 is a correct polarity 2-4 transition pattern, will replace the 4 by inverting the output stream after the 2 of the 2-4 transition pattern (FIG. 10 at 1007). Those skilled in the art will recognize that inverting the waveform operates for encoding/decoding methods that can properly decode without concern for the logical polarity. After replacement the up/down counter eventually reads the replaced pattern and counts accordingly towards zero (1006). The encoder then waits until the up/down counter has again exceeded the offset limit before replacing another pattern and reinverting the output stream.

Figure 11:
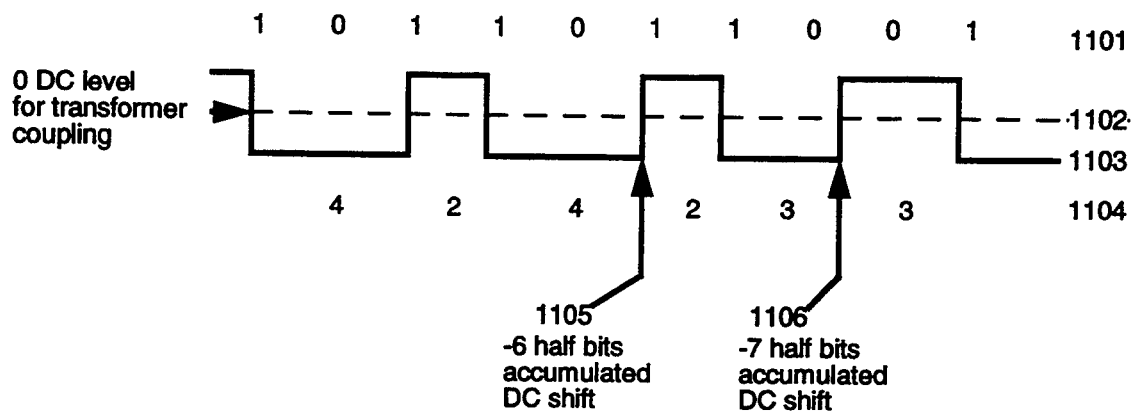
FIG. 11 illustrates a negative accumulation of DC Offset by a worst case pattern.
Figure 12:
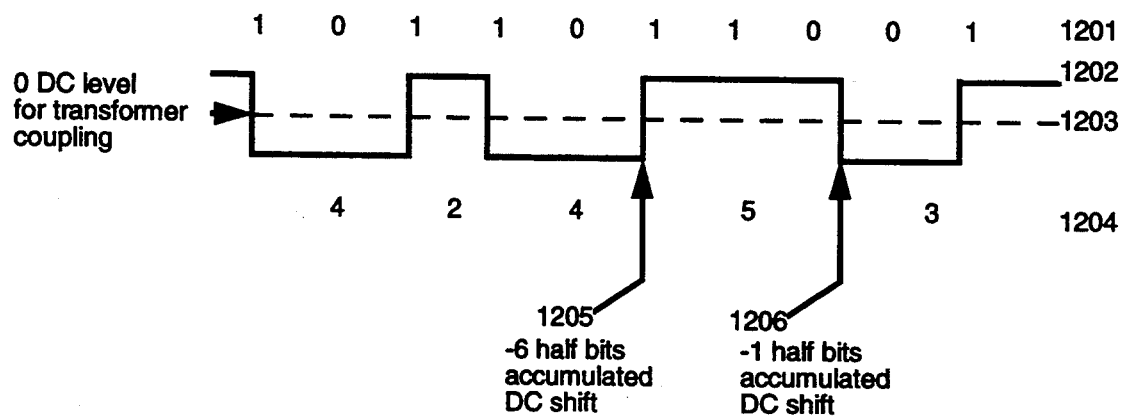
FIG. 12 illustrates the concept of eliminating DC Offset by replacing a 2-3 transition pattern by a 5.

As another example, assume the counter has exceeded the count limit of negative six as illustrated by FIG. 11. The encoder looks ahead searching for a 2-3 or 2-4 transition pattern of the "correct polarity" in the encoded bit stream. Assume that the encoder detects a 2-3 transition pattern of the correct polarity before finding a 2-4 transition pattern. The encoder replaces the 2-3 transition pattern with a 5 as illustrated by FIG. 12. As discussed above the "correct polarity" replacement 5 has a polarity that reduces the accumulated DC offset. If DC offset is negative six or of larger magnitude then a 2-3 transition pattern (where 2 is of positive polarity and 3 is of negative polarity) would be substituted by a +5 transition pattern. Under the case where the offset is plus six or greater then a 2-3 bit pattern (where the 2 is of negative polarity and the 3 is of positive polarity) would be substituted with a −5. As described above, replacement is accomplished by inverting (or changing the polarity) the data stream after the transition period 2.

As a final example, the output waveform may be self correcting. In this case no replacement is made. Assume the counter has exceeded the count limit of plus six. The encoder looks ahead in search of a 2-3 or 2-4 transition pattern of the proper polarity. While this search proceeds, if the encoded bit stream has more negative polarity transition periods than positive polarity transition periods, the counter will count below the plus six count limit. Thus, the encoded stream self corrects the encoder so that the search for a replacement is no longer necessary.

When the limit of plus six or minus six half bits has been reached or exceeded, one of two things will happen. Either (i) a replacement opportunity of the correct polarity will appear, and a replacement 5 or 6 will compensate for the offset, or (ii) a replacement opportunity is unavailable and the encoded pattern is self correcting.

Those skilled in the art will recognize, DT encoding that utilizes offset replacement encoding will function with other pre-encoding methods such as FM0, FM1, as well as Manchester. Prior art methods, such as Miller Squared, have attempted to generate a DC free code that function only with a Miller code. The offset replacement encoding method as described above and the associated apparatus described below operates on a broader range of types of codes or encoding (pre-encoding) methods.

Figure 1:
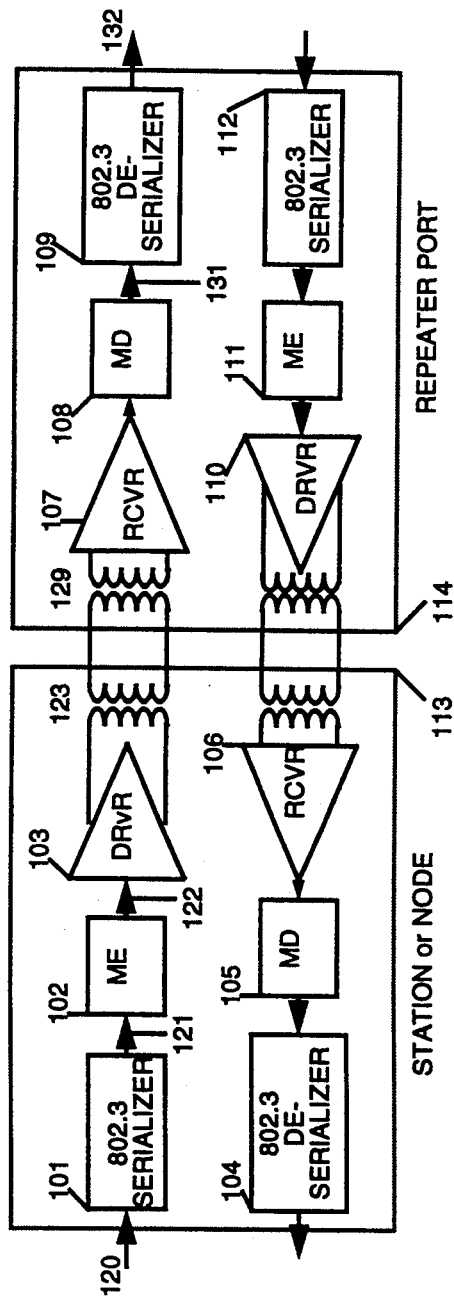
FIG. 1 illustrates prior art IEEE 802.3 local area network utilizing an unshielded twisted pair connection media (10-BASE-T).
Figure 2:
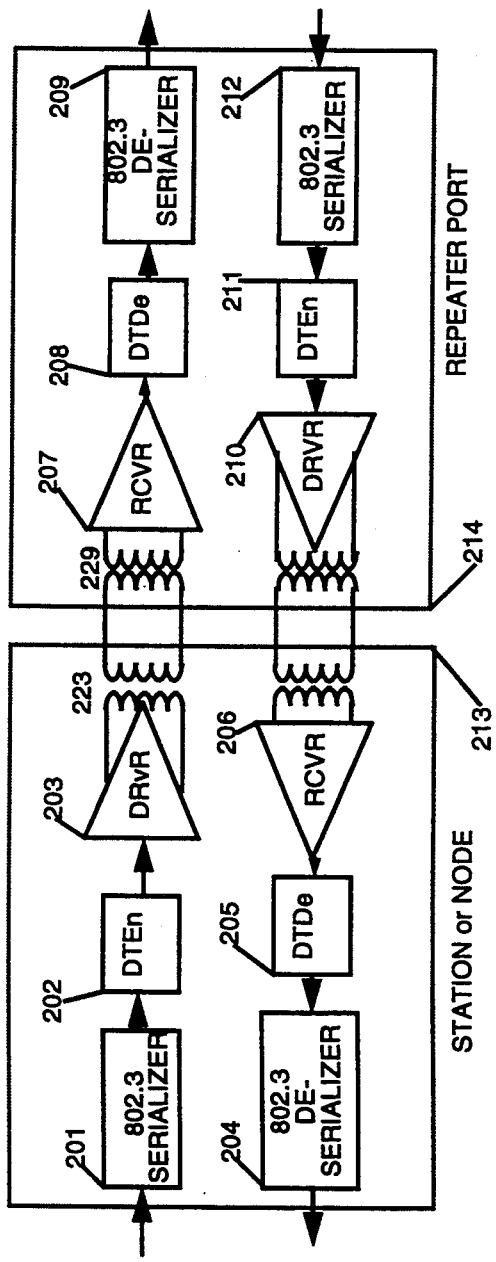
FIG. 2 illustrates IEEE 802.3 local area network utilizing Double Toggle (DT) encoding/decoding for an unshielded twisted pair connection media (10-BASE-T).
Figure 15:
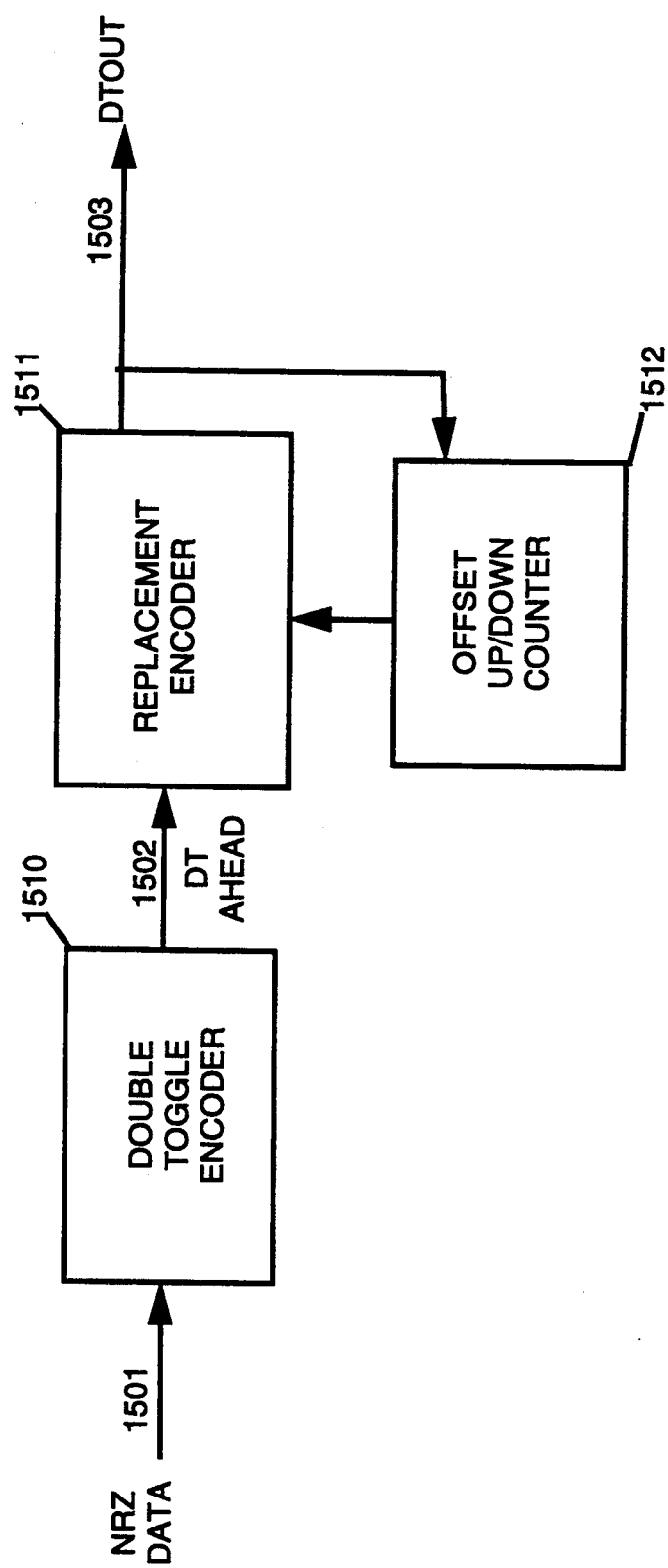
FIG. 15 illustrates the basic structure of the DT transmitter/encoding system.
Figure 23:
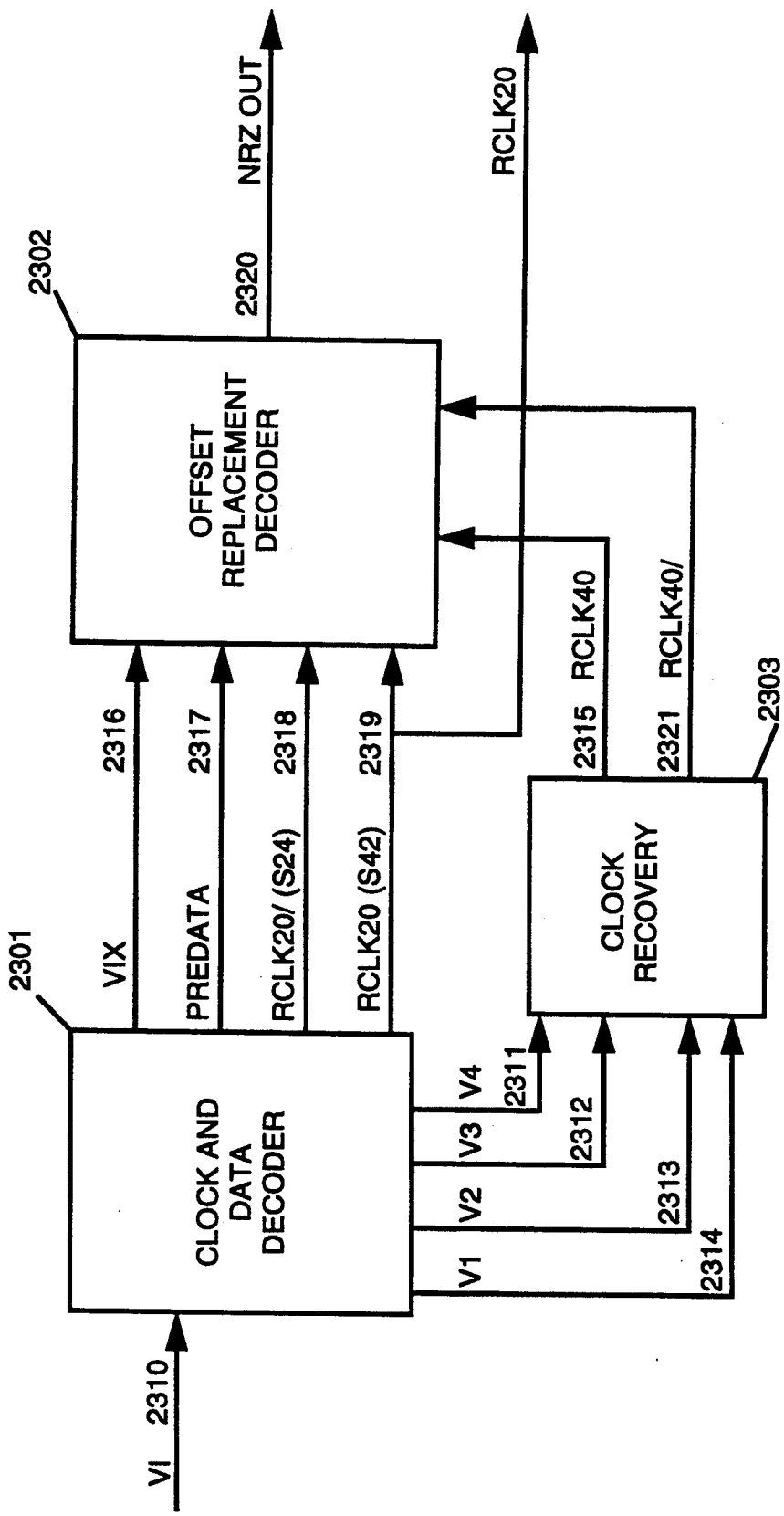
FIG. 23 illustrates the basic structure of the DT receiver/decoding system.

The present invention is envisioned as operating in LAN systems such as those depicted in FIG. 13 and FIG. 14. FIG. 2 illustrates the use of DT encoding and decoding in station 213 and repeater port 214 for a multiport repeater topology of FIG. 13. Station 213 is an example connection of "station 1" 1302 through "station N" 1304 with the individual UTP wires 1305 through 1307. Repeater port 214 is an example connection between the multi-port repeater 1301 and the individual UTP wires 1305 through 1307. As compared to the prior art, DT encoders 202 and 211 replace Manchester encoders 102 and 111 of FIG. 1. DT decoders 208 and 205 replace Manchester decoders 108 and 105. As described above the coupling transformers as well as the transformer receivers and drivers may require design modifications or replacement. FIG. 15 illustrates a block diagram of DT encoders 202 and 211. FIG. 23 illustrates a block diagram of the DT decoders 208 and 205. In the coax based topology of FIG. 14, "station 1" 1401 through "station M" 1403 would contain a DT encoder and decoder as well. Below is a detailed description of the apparatus of the DT encoder and decoder. The DT encoder performs DT encoding and offset replacement generating an offset compensated DT encoded waveform. The DT decoder decodes the offset compensated DT encoded waveform to generate NRZ data.

DT ENCODING AND OFFSET REPLACEMENT APPARATUS

FIG. 15 illustrates the apparatus of a DT encoder that converts an NRZ data stream 1501 into a DC offset compensated DT encoded data stream 1503 (DTOUT). The Double Toggle encoder 1510 encodes the NRZ data stream 1501 into Double Toggle encoded data 1502. Replacement encoder 1511 and offset up/down counter 1512 perform DC offset compensation producing the compensated DT encoded data 1503. For reasons of clarity many of the control signals are absent from each of the drawings.

DT ENCODING APPARATUS

Figure 16:
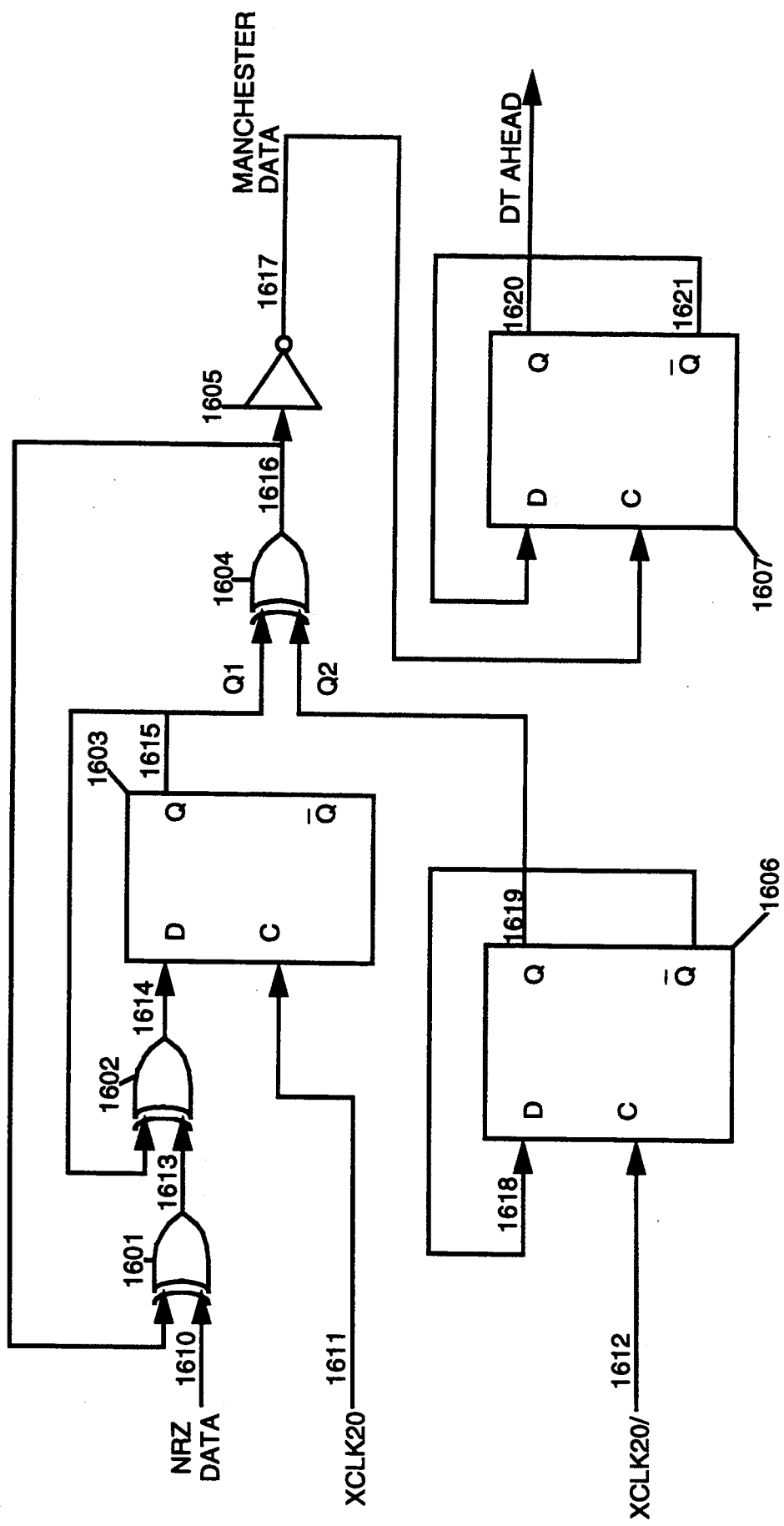
FIG. 16 illustrates the DT encoding apparatus without offset compensation using a Manchester pre-encoding means.
Figure 17:
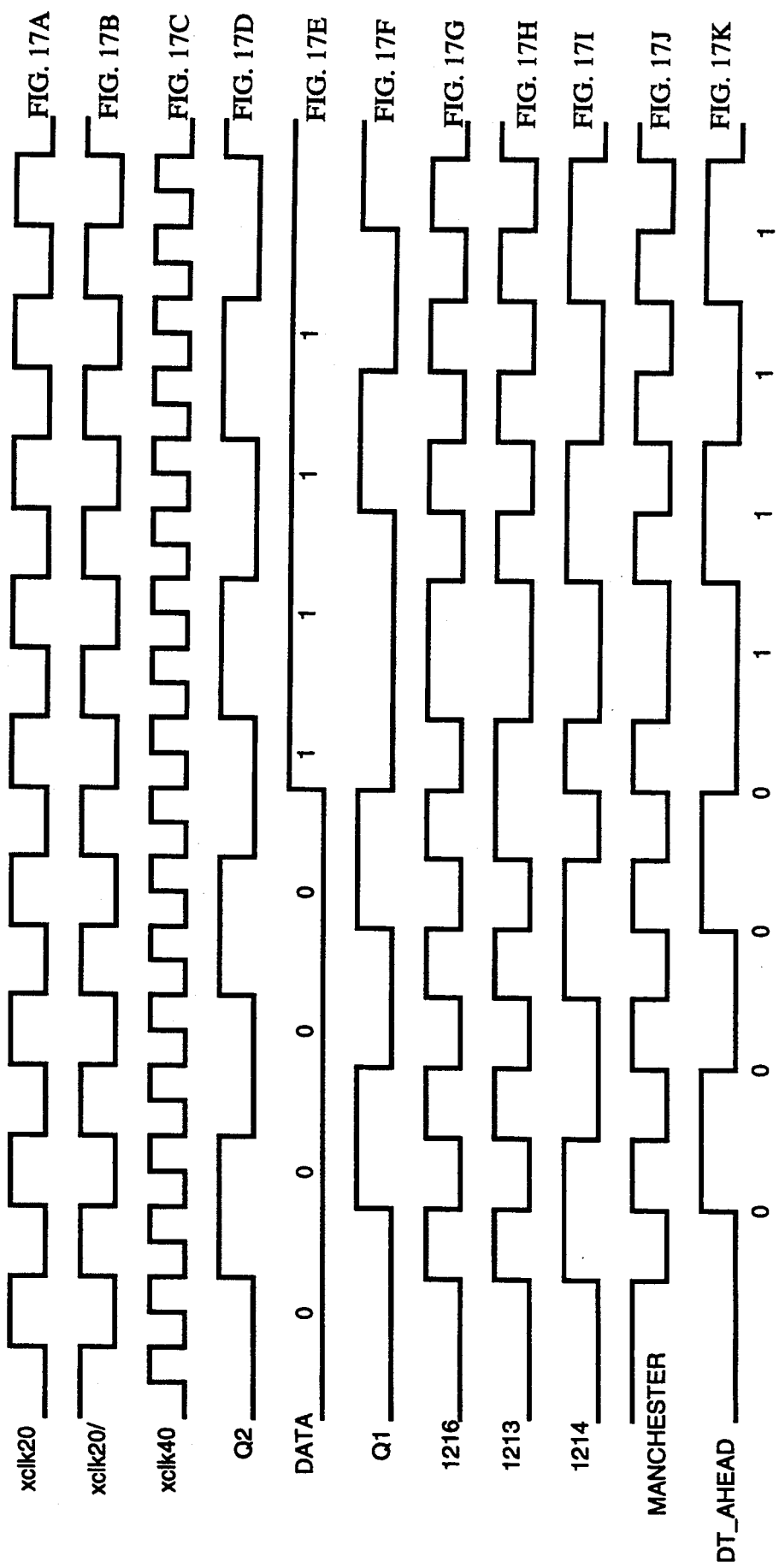
FIGS. 17A–17K illustrate the timing required to generate DT encoded data from Manchester pre-encoding.

FIG. 16 illustrates circuitry to pre-encode NRZ data into Manchester encoded data and then re-encode the Manchester pre-encoded waveform into Double Toggle data. D flip flop 1606 converts the negative phase of the 20 MHz transmit clock (XCLK20/) 1612 into a 10 MHz clock at D flip flop output 1619. Exclusive OR 1601, exclusive OR 1602, D flip flop 1603, and exclusive OR 1604 combine to create a controlled 10 MHz clock at output 1615. Output 1615 is controlled by NRZ data input 1610 that generates transitions within the center of a bit cell. Output 1619 has transitions on the edge of the bit cell. When input 1610 changes to a different logic level (changes state) it causes output 1615 to skip a pulse. This allows the output 1616 to completely change phase by 180 degrees via signal 1615, signal 1619, and exclusive OR 1604. Exclusive OR 1604 combines input 1615 with input 1619 to create a 20 MHz bandwidth waveform. Inverter 1605 corrects the polarity at output 1616 to generate Manchester encoded data. D flip flop 1607 then encodes Manchester encoded data 1617 into Double Toggle encoded data 1620. D flip flop 1607 also reduces the 20 MHz bandwidth signal, input 1617, down to a 10 MHz bandwidth signal at D flip flop output 1620. FIGS. 17A–17K illustrates detailed waveforms for this circuitry. Control signals that clear the flip flops, such as power on reset, are not shown.

OFFSET REPLACEMENT ENCODING APPARATUS

Figure 18:
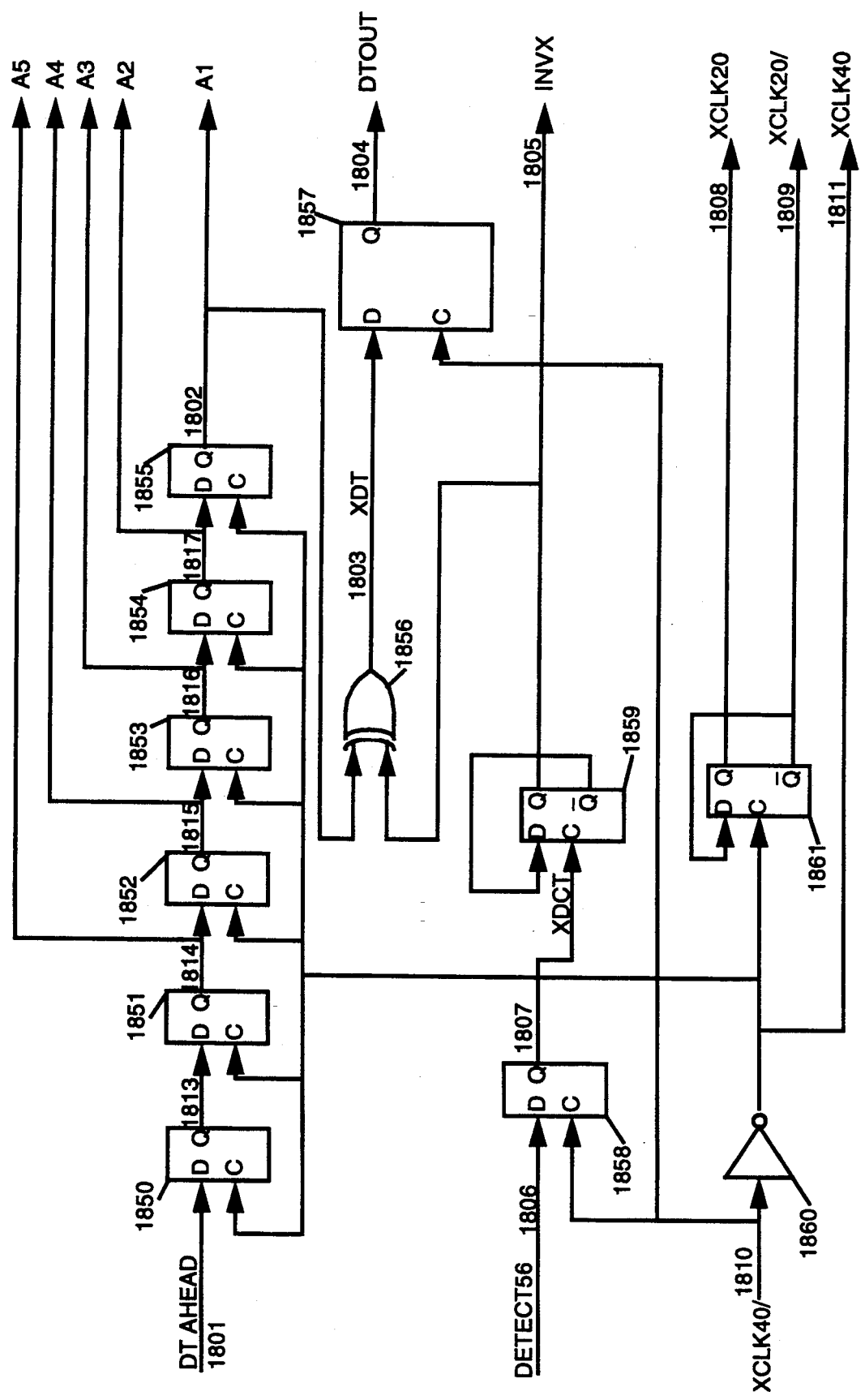
FIG. 18 illustrates the replacement encoding apparatus to compensate for an accumulated DC offset.
Figure 19:
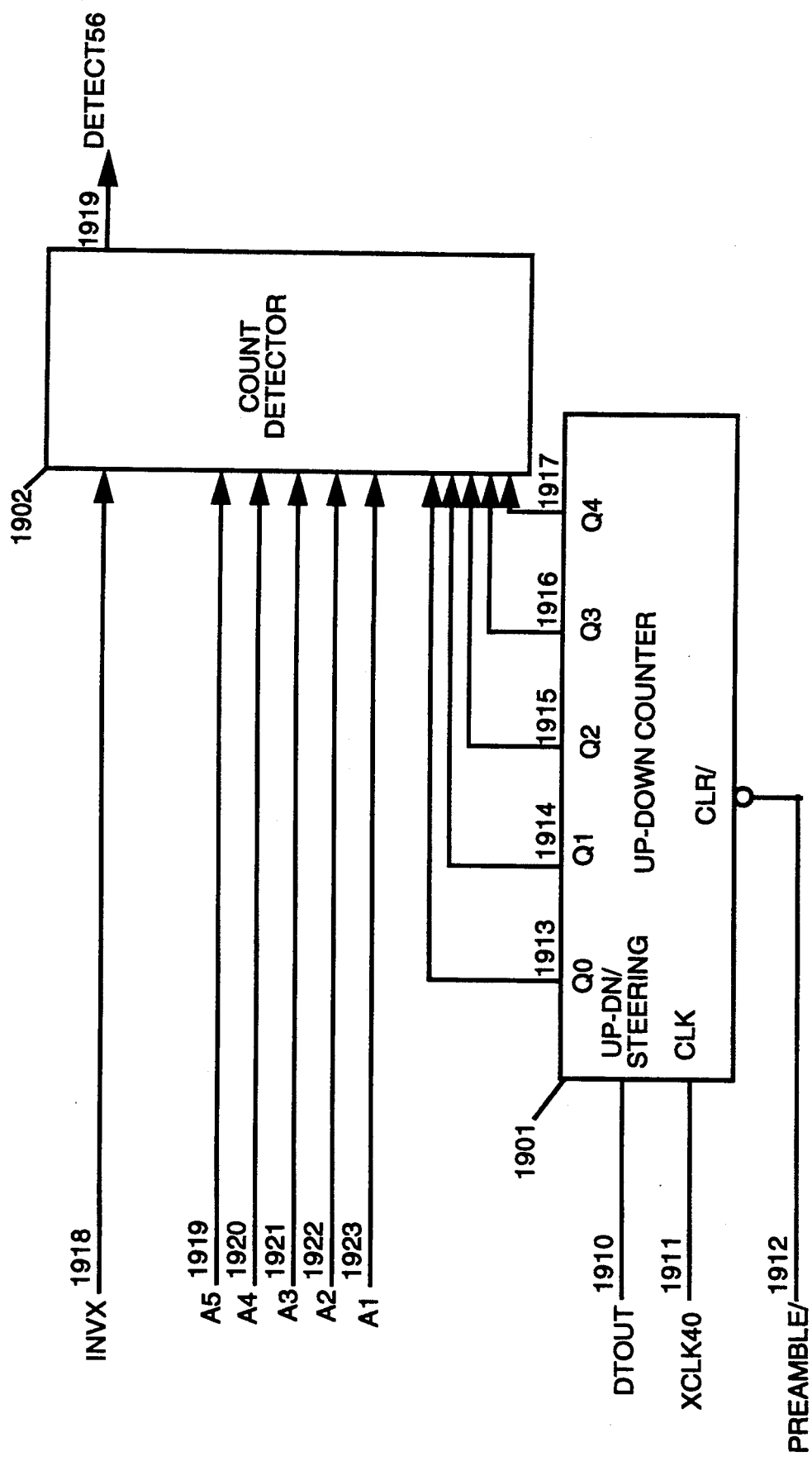
FIG. 19 shows the offset up/down counter utilized to count an accumulated DC offset and detect a transition pattern for possible replacement.
Figure 21A:
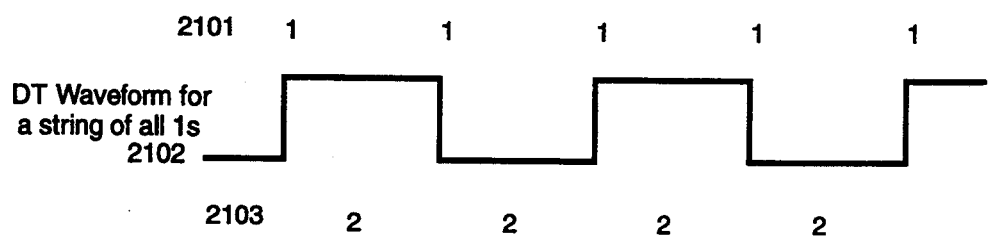
FIGS. 21A–21D show the relationship between a DT encoded waveforms and a recovered clock for NRZ data streams of all ones or zeroes.
Figure 21B:
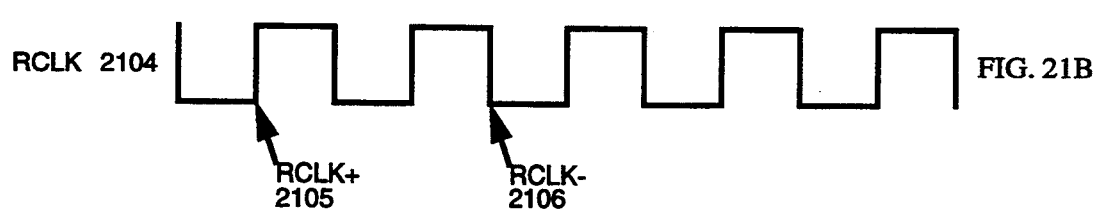
Figure 21C:
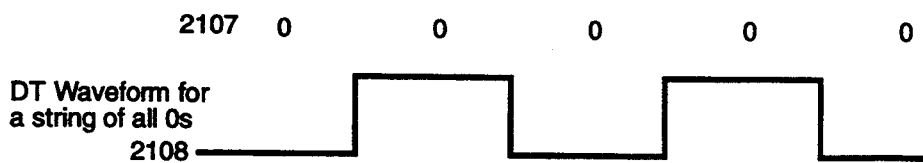
Figure 21D:
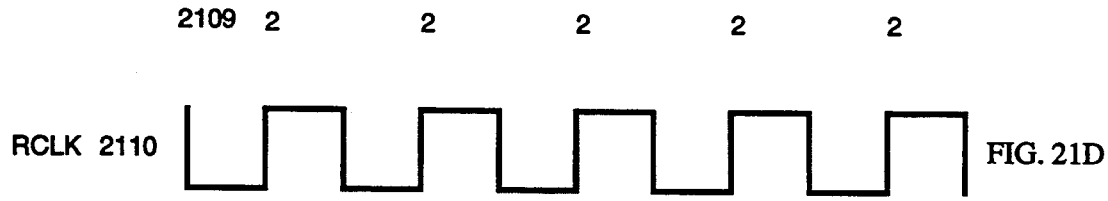

Reduction in DC offset is accomplished by the apparatus illustrated in FIG. 18 and FIG. 19. In order to reduce the offset, three main objectives must be accomplished. First the accumulated amount of DC offset due to the present output waveform, DTOUT, must be counted. Secondly, after the accumulated count exceeds some limit, the apparatus must search for the proper replacement pattern within the waveform that can reduce the accumulated DC offset. Thirdly, after a correct polarity pattern is detected, the apparatus must invert the waveform after the 2 of the 2-3 or 2-4 transition pattern. Finally it outputs this partly inverted waveform that has been compensated for an accumulated DC offset as DTOUT.

DC offset that is transmitted out of the encoding system and into the media of the communication channel must be accumulated. Up-Down counter 1901 accomplishes this task. Counter 1901 is initialized to zero while the standard preamble known in the prior art is being transmitted. The preamble is an initialization signal for the communication channel. Input signal 1912 clears counter 1901 during the preamble. The preamble need not be counted because its waveform has an equivalent number of ones and zeroes averaging out to zero DC offset. When the preamble is finished and DT encoded data is transmitted from output 1804, then input signal 1912 is no longer asserted so that the counter begins counting. Counter 1901 counts half bit periods of a 20 MHz clock. Clock input signal 1911 sent to counter 1901 is a positive phase 40 MHz transmit clock. Polarity of the final compensated DT encoded output controls the direction of the count. If input 1910, the final compensated DT encoded output, is of positive polarity, then clock input 1911 causes counter 1901 to count positively. If input 1910 is of negative polarity, then counter 1901 counts negatively. The accumulated count of DC offset is output as a binary count through outputs 1913, 1914, 1915, 1916, and 1917 and is sent to count detector 1902. Those skilled in the art will recognize that the size of the counter is a function of the chosen DC offset limit.

Count detector 1902 constantly monitors the count of accumulated DC offset from the transmitted data as well as the upstream DT encoded pattern. This allows the count detector to determine the proper moment to compensate. Half bits of the upstream data are temporarily held by a six bit look ahead shift register consisting of D flip flops 1850, 1851, 1852, 1853, 1854, and 1855. Storing half bits requires the positive phase 40 MHz clock, input 1811. The stored half bits at D flip flop outputs 1814, 1815, 1816, 1817, and 1802 are input into count detector 1902 (at inputs 1919, 1920, 1921, 1922, and 1923) to determine if a 2-4 or 2-3 replacement of correct polarity is available.

As described above, the replacement of a 2-3 or 2-4 transition pattern into a 5 or 6 transition pattern is accomplished by inversion. The data stream after the 2 of the 2-3 or 2-4 transition pattern is inverted to the same polarity as the 2. This transforms the 2-3 or 2-4 pattern into a 5 or 6. In the case that inverting signal 1805 is true (one), DT encoded data 1802 is inverted by exclusive OR 1856 into output 1803. In the case that inverting signal 1805 is false (zero), DT encoded data 1802 is passed through exclusive OR 1856 via output 1803. Inverting signal 1805 is input into count detector 1902 at input 1918 because the current status of the inversion process affects the search for the proper replacement transition pattern.

The process of selecting or detecting the proper 2-3 or 2-4 transition pattern and thereby generating the inverting signal 1805 is accomplished by count detector 1902. Let us first examine the two cases that involve positive DC offset values that are greater than or equal to an offset limit of six (00110 binary or 06 hex) and remain less than 15 (01111 binary or 0F hex). In the case that inverting signal 1805 is initially false (zero), then count detector 1902 respectively searches for a 2-3 transition pattern of 00111 binary from the look ahead shift register outputs 1802, 1817, 1816, 1815, and 1814. The pattern 00111 is replaced or transformed into 00000 by means of count detector 1902 outputting detect signal 1919. In the case that inverting signal 1805 is initially true (one), then count detector 1902 searches for a 2-3 transition pattern of 11000 binary. Since the output stream is initially being inverted, the transition pattern 11000 is uninverted after the 11 such that the last three half bits (000) are directly fed to the output. In other words the first two half bits (11) of the transition pattern will be inverted to 00 (because inverting signal is true) while the last three half bits (000) will not be inverted (inverting signal changes to false). The combined pattern that is finally output is 00000. While these compensated half bits (00000) are being output, counter 1901 continues to count and counts the 00000 pattern so as to reduce the positive DC offset.

Now let us examine the two cases that involve negative DC offset values less than or equal to negative six but greater than or equal to negative fifteen (for a range of values less than or equal to 10101 binary but greater than or equal to 10000 binary twos complement notation). In the case that inverting signal 1805 is initially false (zero), the count detector 1902 searches for a 2-3 transition pattern of 11000. The transition pattern 11000 will be replaced or transformed into a compensated output pattern of 11111. The extra ones will reduce the magnitude of the negative DC offset. In the case that inverting signal 1805 is initially true (one), then count detector 1902 searches for a 2-3 transition pattern of 00111 that is temporarily stored in D flip flops 1855, 1854, 1853, 1852, and 1851 respectively. Since inverting signal 1805 is true, the compensated DT encoded output stream is presently being inverted. Normally pattern 00111 would be inverted to 11000. However in order to effect this replacement, the first two bits will still be inverted but the remaining three and those thereafter will not be inverted. This effectually transforms the 11000 pattern into 11111. This enables the up-down counter 1901 to count five ones to reduce the magnitude of the accumulated negative DC offset.

If count detector 1902 detects one of the replacement patterns described above it generates a detection pulse 1919. Detection pulse 1919 is conditioned and synchronized with the negative phase of the 40 MHz transmit clock at D flip flop 1858. D flip flop 1858 delays and stretches the pulse width of the signal at D flip flop output 1807. Output 1807 clocks D flip flop 1859, configured as a toggle flip flop, toggling output 1805 from its previous state, thus generating the inverting signal. Inverting signal 1805, as described above, controls the inversion process at exclusive OR 1856. Output 1803 of exclusive OR 1856 is finally conditioned and synchronized with the negative phase of the 40 MHz clock 1810 at D flip flop 1857. D flip flop 1857 outputs DC offset compensated DT encoded data at output 1804. Detailed timing of this circuitry is provided by FIGS. 20A-20K.

RECEIVER/DECODER

FIG. 23 illustrates the apparatus to decode and convert a DT encoded serial bit stream 2310, that has been compensated for DC offset, into an NRZ serial bit stream 2320. Clock and data decoder 2301 generates NRZ data but retains any changes that were made by DC offset compensation performed at the encoder. Clock and data decoder 2301 further generates clock states (V1, V2, V3, and V4) that can be utilized to recover other clocks necessary to finish the decoding process. Clock regenerator 2303 utilizes the clock states to generate a recovered 40 MHz clock. Offset replacement decoder 2302 recovers the information that was changed in the process of DC offset compensation, thus generating the final output, NRZ data 2320.

CLOCK DECODING/RECOVERY

Synchronized serial communication channels require that the clock be recovered or separated from the data to decode an encoded bit stream within a serial signal waveform. DT decoding requires that an accurate clock be recovered in order to detect transitions within the serial signal waveform that are coincident with a clock edge. Three different methods of clock recovery are briefly described in order to facilitate decoding a compensated DT encoded bit stream.

The first method that is familiar to those skilled in the art is the use of digital phase locked loops (DPLL). A DPLL is a circuit that utilizes a clock multiplier to recover data and receive a clock. The clock multiplier multiplies by a value (usually greater than six). Unfortunately, this can inject energy at high frequencies (greater than 10 MHz) onto the UTP wires. Furthermore a DPLL tends to generate large amounts of electromagnetic radiation that can add noise to the encoder and decoder, making it difficult to meet national and international emissions standards. Therefore, the use of a DPLL is not optimal in this invention.

A second method of recovering the clock utilizes an analog Phase Locked Loop (PLL). A PLL circuit is better than a DPLL because it generates little noise as it smoothly tracks an incoming waveform to extract the embedded clock. The recovered clock is referred to as RCLK. Assume that the positive edge of RCLK is in the middle of the bit cell. Thus the positive edge of RCLK (referred to as RCLK+) will align with a decoded "1". The negative edge of RCLK (RCLK−) could be chosen to align with the center of a bit cell as well. It is important that one or the other is selected to be consistent.

Characteristics of DT encoded data require that the PLL clock recovery operates with both the positive and negative edges of the recovered clock. In FIGS. 21A–21D, a string of logical ones provides continuous data transitions aligned with RCLK+ (2105). A string of zeroes will give continuous data transitions aligned with RCLK− (2106). Therefore synchronization could be lost in a long string of zeroes if RCLK was corrected utilizing only RCLK+. Thus, PLL clock recovery requires clock corrections on both RCLK+ and RCLK−.

Figure 22:
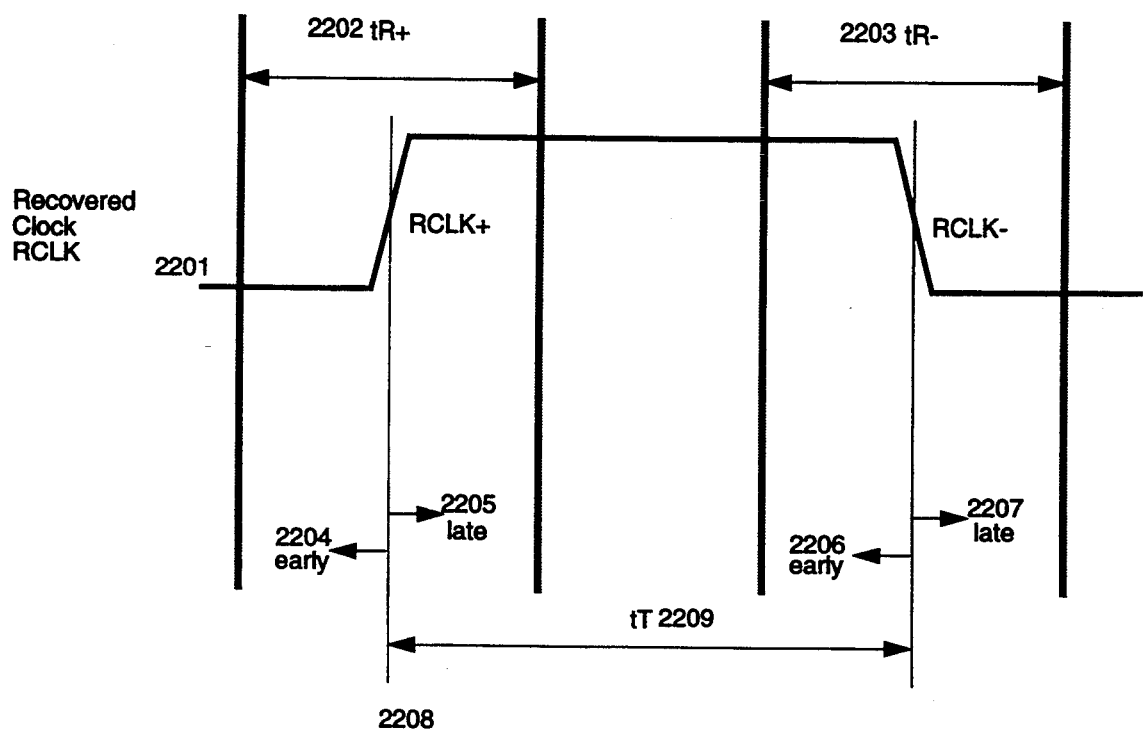
FIG. 22 details a recovered clock.

Transitions in a DT waveform should align with either RCLK+ or RCLK− within a specific range of time, respectively referred to as tR+ (2202) and tR− (2203) of FIG. 22. The exact value of this range depends on the particular PLL design. A transition within the ranges tR+ or tR− will be either early or late with respect to the clock edge. The PLL advances or delays RCLK accordingly. PLL sensitivity to jitter is a function of the width of the transition range, tR+ or tR−, relative to the period of RCLK (referred to as tT 2208). A wide range is less sensitive to jitter than a narrow range. Any DT data transition outside the ranges, tR+ or tR−, must be considered as an error in the DT waveform.

While analog phase lock loops generate little noise, and may also be a preferred method, it may be simpler to integrate a fully digital Double Toggle system into a monolithic device.

A third method of recovering the necessary clock information is to use precision silicon delays. Using silicon optimized for digital technology, it is possible to use precision silicon delay circuits to facilitate manufacturing the DT decoder as an integrated circuit. Commercially, such precision delays are available from Dallas Semiconductor as part number DS 1005. It is technically feasible to construct a DT decoder utilizing precision silicon delays as an element to generate precision clock pulses. Because of the objective of implementing a DT encoder/decoder on a digital integrated circuit, this third clock recovery method is preferred. The apparatus for using precision silicon delays is described below.

PRECISION SILICON DELAY CLOCK RECOVERY

Figure 24:
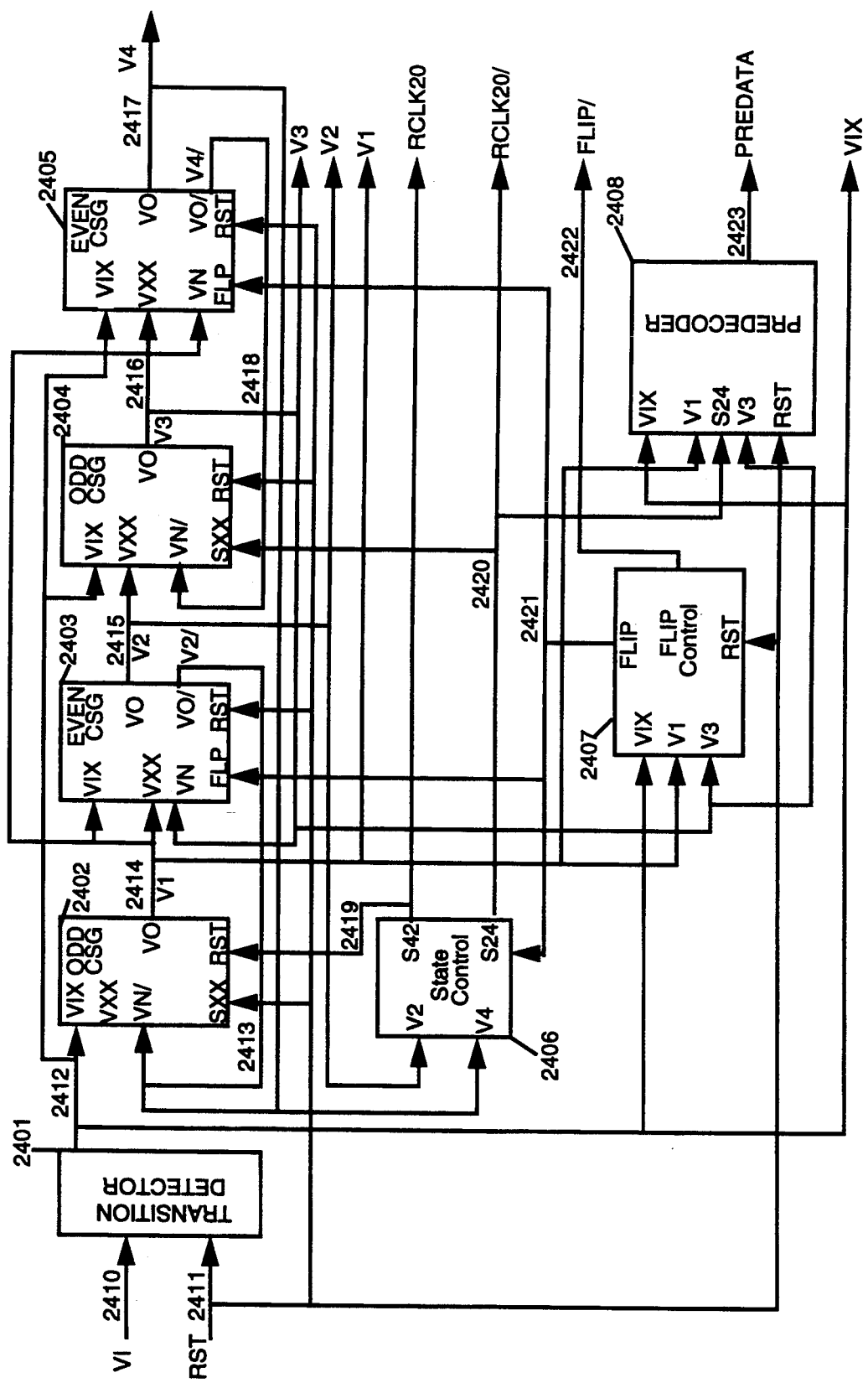
FIG. 24 illustrates the basic structure to recover clock information and preliminary data.
Figure 33:
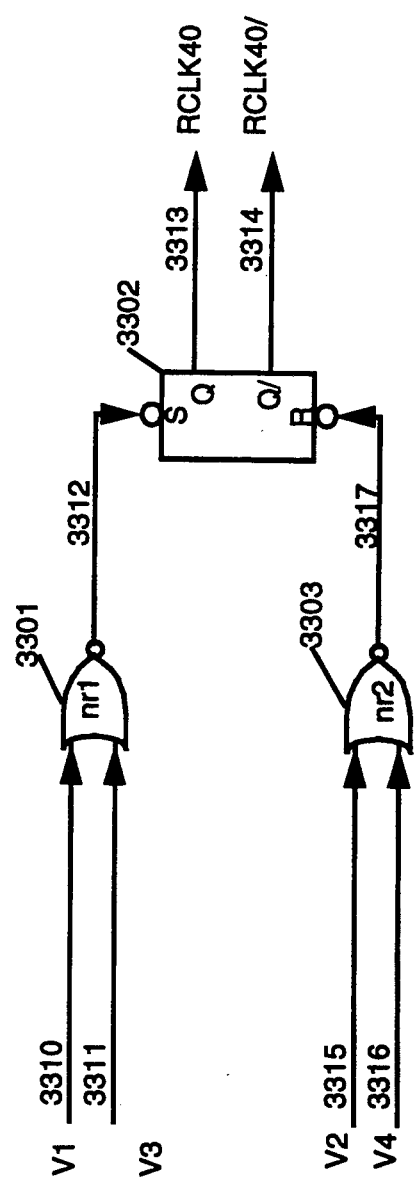
FIG. 33 shows the 40 MHz clock recovery circuitry to generate RCLK40.

To detect a 5H and 6H substituted transition pattern for the 2-3 and 2-4 replaceable transition pattern, the clock recovery system (also referred to as a clock decoder) must generate a clock that is four times the maximum frequency of the received waveform. This allows the number of half bits within a transition period to be counted. Thus a clock that operates at four times the baseband frequency limit is necessary. In the case of IEEE 802.3, the baseband rate is 10 MHz so this requires a clock frequency of 40 MHz, with a corresponding period of 25 nanoseconds. FIG. 24 illustrates the digital circuitry that generates four nonoverlapping clock states utilized to create a 40 MHz clock. The clock states (herein designated as V1, V2, V3, and V4) are pulses of approximately 12.5 ns in width. Based on simulation results, values smaller than 12.5 ns are preferred and the range from 7 to 10 ns for the clock state pulse width seem to perform the best. The pulse width has a duration that is determined by the precision silicon delays 2704 and 2912 of FIG. 27 and FIG. 29. Each clock state generated is nonoverlaping. No two pulses of any state should be high at the same time. The four of these clock states can be combined to generate the positive and negative phases of a 40 MHz clock as illustrated in FIG. 33.

Figure 26:
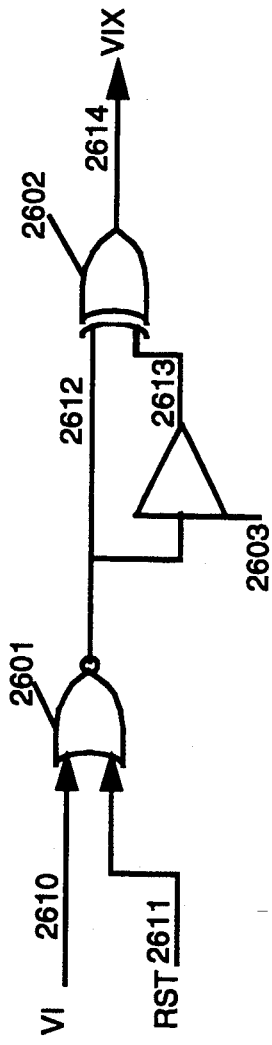
FIG. 26 illustrates the transition detection circuitry

To start the generation of these states the preamble is used. Transition detector 2401 of FIG. 24 detects transitions in order to synchronize the clock as well as recover the data. Details of the transition detector are illustrated by FIG. 26. Exclusive OR 2602 in conjunction with delay element 2603 generate output pulse 2614 (also referred to as a transition detected signal, VIX) in response to encoded input 2610 changing state from low to high or high to low. Reset input 2611 prohibits the detection circuitry from falsely detecting any transitions input into the system until the circuitry is clearly powered up. Pulse width of VIX (2614) is set by the differences in time that delayed input 2613 and undelayed input 2612 are sent into the exclusive OR 2602. If signal noise is a concern, then a hysteresis input can be utilized; but this would require design constraints in other areas and is not used in the preferred embodiment.

Figure 27:
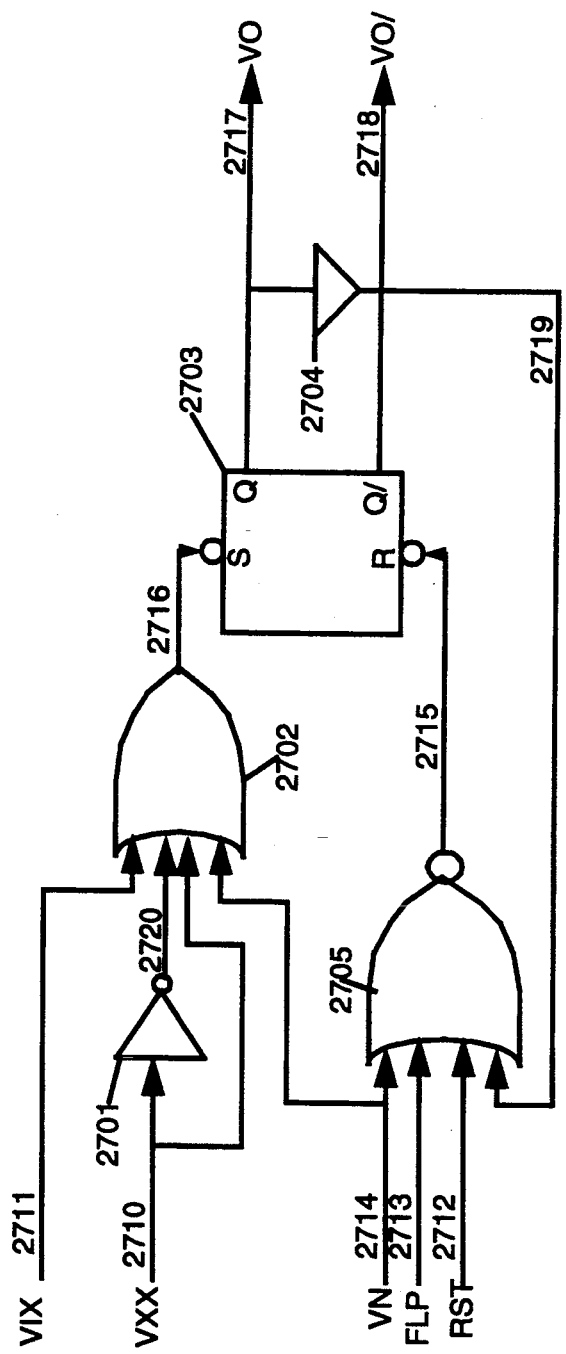
FIG. 27 shows even clock state generator for clock states V2 and V4.
Figure 28:
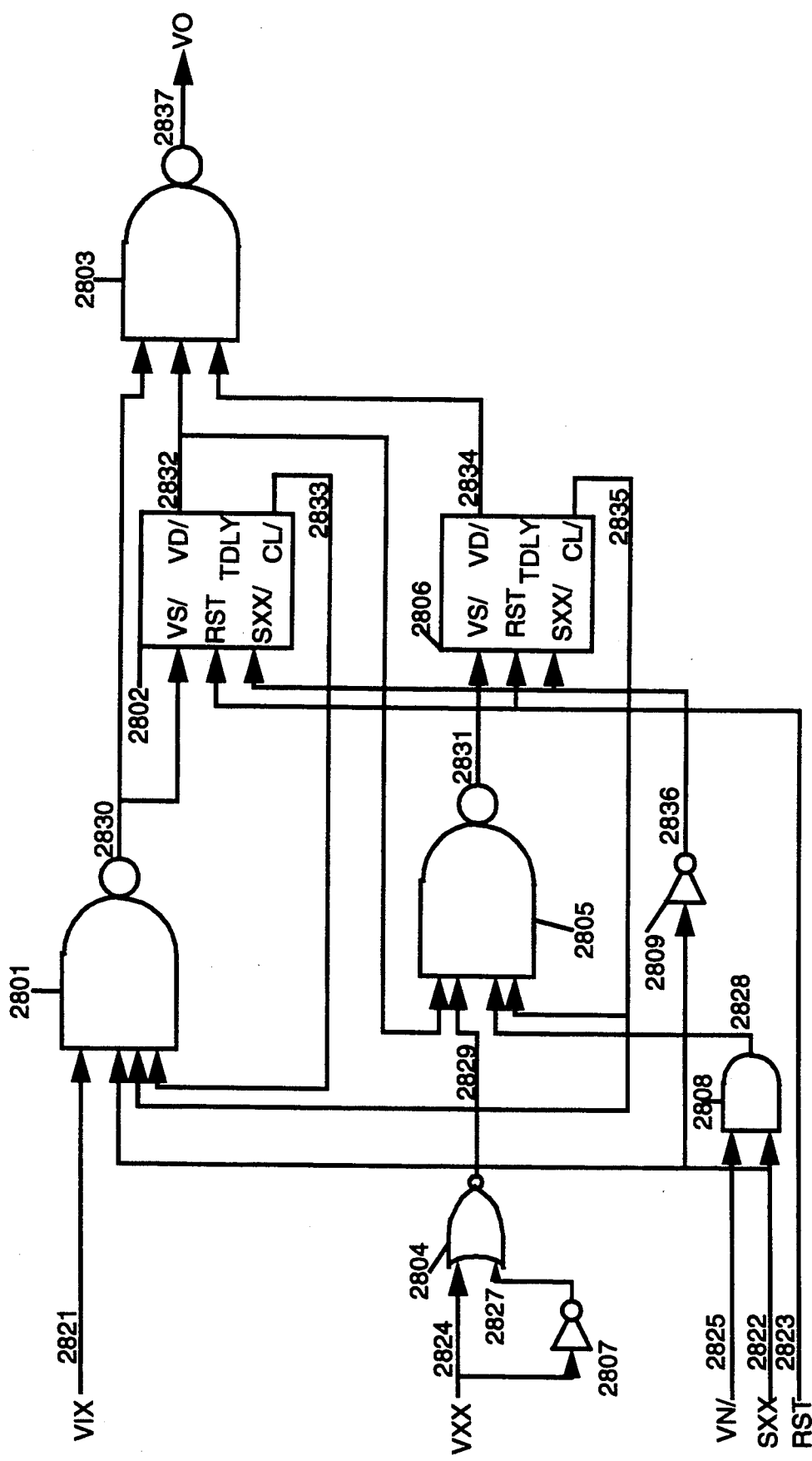
FIG. 28 illustrates odd clock state generator for clock states V1 and V3.
Figure 29:
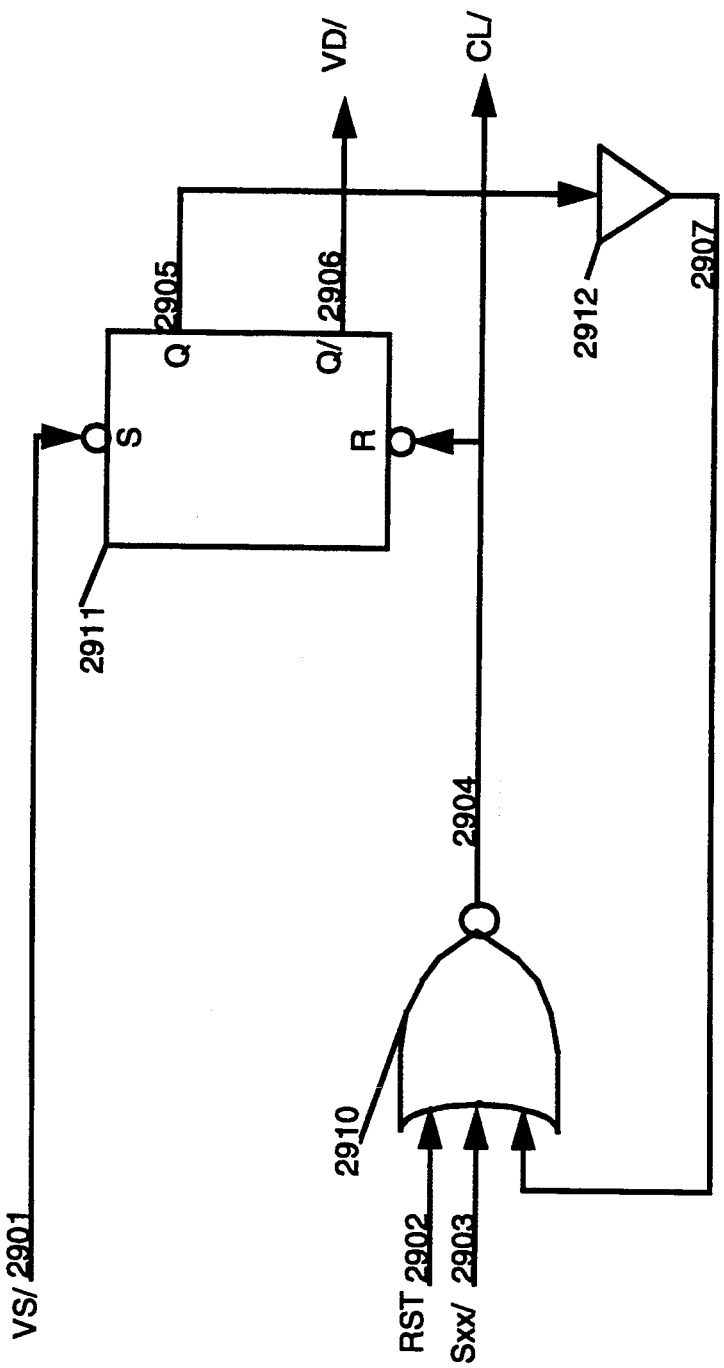
FIG. 29 illustrates delay block of clock state generator of FIG. 28.
Figure 30:
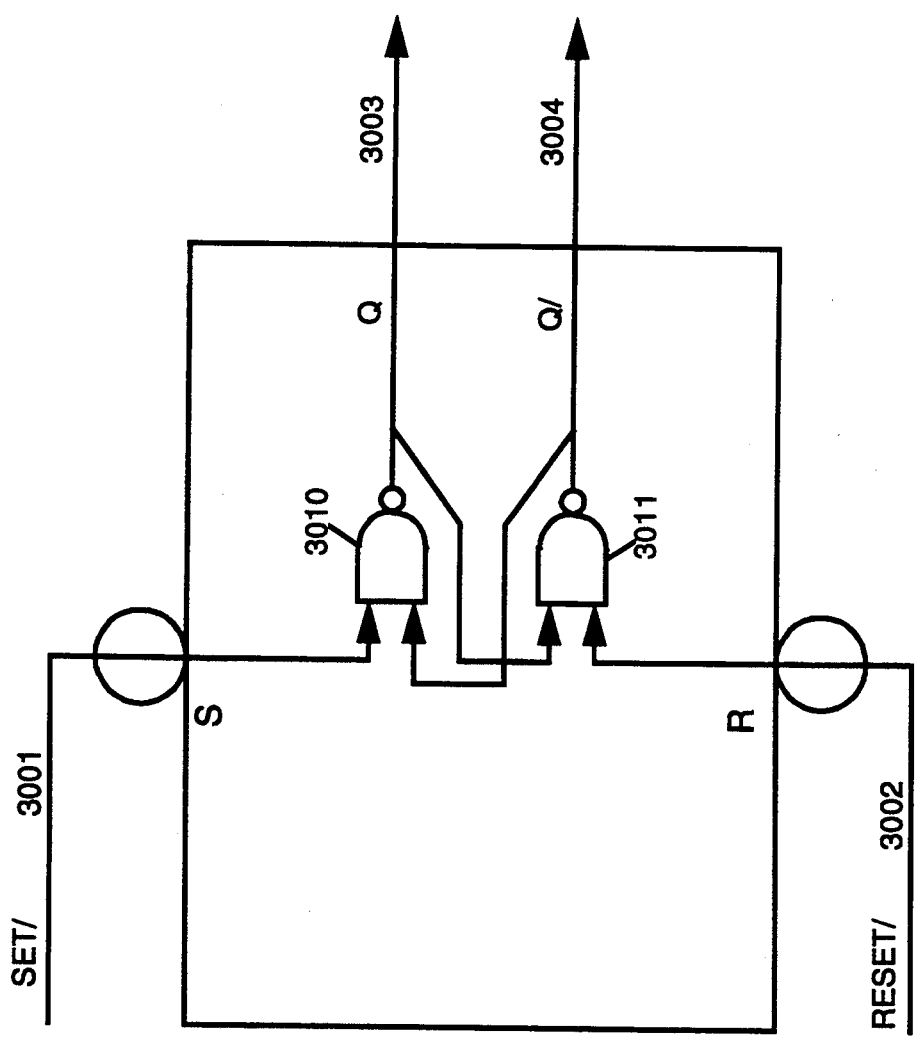
FIG. 30 illustrates the SR flip flop triggered by active low pulses.

Reset input 2611 is conveniently used to initialize or "kick start" the clock state generators by generating a positive pulse for VIX 2614 when reset goes away. The rising edge of VIX at input 2412 starts V1 state generator 2402. FIG. 28 and FIG. 29 illustrate the details of the odd clock state generator that is duplicated to create both V1 state generator 2402 and V3 state generator 2404. FIG. 27 illustrates the details of the even clock state generator that is duplicated to create both V2 state generator 2403 and V4 state generator 2405. The rising edge of VIX is input at NAND input 2821 of FIG. 28. Input signals 2822, 2835, and 2833 are initialized to a one (high logic level). Thus, on the rising edge of VIX NAND output 2830 goes low. Once VIX pulse returns to its low level NAND output 2830 goes back to a high level. In effect VIX pulse 2821 is inverted across NAND 2801. NAND output 2830 is input into delay block 2802. FIG. 29 provides a detailed illustration of delay blocks 2802 and 2806. The inverted VIX pulse from NAND 2801 (2830 of FIG. 28 and 2901 of FIG. 29) is the set input 2901 of the set reset flip flop 2911 (also referred to as SR flip flop). Set input 2901 and reset input 2904 are active low; they cause the flip flop outputs to change state when set or reset transition low. FIG. 30 provides a detailed illustration of the SR flip flop. In the case of initialization, VIX transitions high on its rising edge setting SR flip flop 2911, which generates a high logic level at output 2905. Precision silicon timing delay 2912 delays the transition from a low to a high logic level into output 2907. Similarly, precision silicon timing delay 2912 precisely delays the transition from a high to a low level. It is this precise time delay that generates a very accurate pulse of a clock state. Once the low to high transition has propagated through precision silicon delay 2912, NOR output 2904 transitions low, thus resetting SR flip flop 2911. Output 2905 transitions from high to low, thus completing the period of a pulse utilized to generate clock state V1. NAND 2805 and delay block 2806 operate similarly to NAND 2710 and delay block 2802 to generate a second output pulse 2834 that can occur earlier than output pulse 2832. Once SR flip flop 2911 has transitioned low, then output 2833 becomes high and prepares NAND 2801 for the next transition.

If no other transitions are received, then the state generation circuitry continues to run freely as illustrated by FIGS. 35A-35J. In this case, clock state V1 is triggered by the falling edge of clock state V4. Inverter 2807 and NOR 2804 generate a positive pulse in response to the negative edge (also referred to as falling edge) of clock state V4 at NOR input 2824. NAND 2805, delay block 2806, and NAND 2803 generate a precision pulse representing clock state V1 in a similar manner described above. Thus, V1 state generator 2402 is responsive to transitions of the received encoded data as well as negative edges of clock state V4.

V2 state generator 2403, illustrated by the even clock state generator of FIG. 27, is triggered by the negative edge of clock state V1. Clock state V1 at input 2710 causes OR 2702 and inverter 2701 to generate a negative pulse in response to a negative edge. This sets the SR flip flop 2703, generating the positive edge of clock state V2 at SR flip flop output 2717. Precision silicon delay 2704 delays the feedback path by a precise amount creating the pulse width of clock state V2. SR flip flop 2703 is not reset until the positive edge (rising edge) of clock state V2 has propagated through precision silicon delay 2704 and NOR 2705. Upon reset of SR flip flop 2703, clock state V2 goes low, thus generating the negative edge of the pulse.

V3 state generator 2404, illustrated by FIG. 28, operates in a similar manner to V1 state generator 2402. Both attempt to generate clock state pulses in response to an input transition VIX or the negative edge of the previous clock state. NAND 2801, delay block 2802, and NAND 2803 attempt to generate a clock state pulse in response to input transition VIX. Inverter 2807, NOR 2804, NAND 2805, delay block 2806, and NAND 2803 attempt to generate a clock state pulse in response to the negative edge of the previous clock state.

V4 state generator 2405, illustrated by the even clock state generator of FIG. 27, operates in a similar manner as V2 state generator 2403. Both generators attempt to generate a clock state pulse on the negative edge of the previous clock state. Each clock state generator is responsive to the negative edge of the previous clock state pulse. Thus the clock state generators can be freely run after reset input 2611, as described above, "kick starts" V1 state generator.

However in order to recover data from the encoded input stream, the clock must align or synchronize to transitions of the waveform. It is preferred that the preamble of the data stream be utilized to synchronize the clock. In the preferred embodiment, clock states V1 and V3 align with transitions from the DT encoded preamble. Alternatively clock states V2 and V4 could have been chosen. In order to align clock states V1 and V3, detected transitions (VIX) are input to V1 clock state generator 2402 and V3 clock state generator 2404. Depending upon the appropriate phase, VIX attempts to generate a clock state pulse. To prohibit V2 and V4 from aligning with transitions, VIX is input to V2 clock state generator 2403 and V4 clock state generator 2405 to stop the generation of a clock state pulse. VIX is sent to OR input 2711 of FIG. 27. VIX is high if a transition is detected and prevents OR output 2716 from going low to set SR flip flop 2703 which generates a V2 or V4 clock state pulse. In the case that V1 or V3 clock states are generated and V2 or V4 clock state pulses are high, V2 and V4 clock states are forced low. Thus, clock state V1 is input to V4 state generator 2403. V1 clock state is sent to NOR input 2714 to reset SR flip flop 2703 of V4 state generator 2403. Similarly, V3 clock state is sent to NOR input 2714 to reset SR flip flop of V2 state generator 2405.

The desired phase relationships for the preferred embodiment of the 20 MHz and 40 MHz recovered clocks with those of clock states V1, V2, V3, and V4 is illustrated by FIGS. 35A-35J. Recovered 40 MHz clock, RLCK40, is a summation of pulses from clock state V1 and V3. RCLK40 is generated by the apparatus illustrated in FIG. 33. SR flip flop 3302 is set on the positive edges of clock state V1 and clock state V3. SR flip flop 3302 is reset on the positive edges of clock state V2 and clock state V4. Thus, RCLK40 is generated as depicted by waveform 3505 in FIG. 35G.

Figure 32:
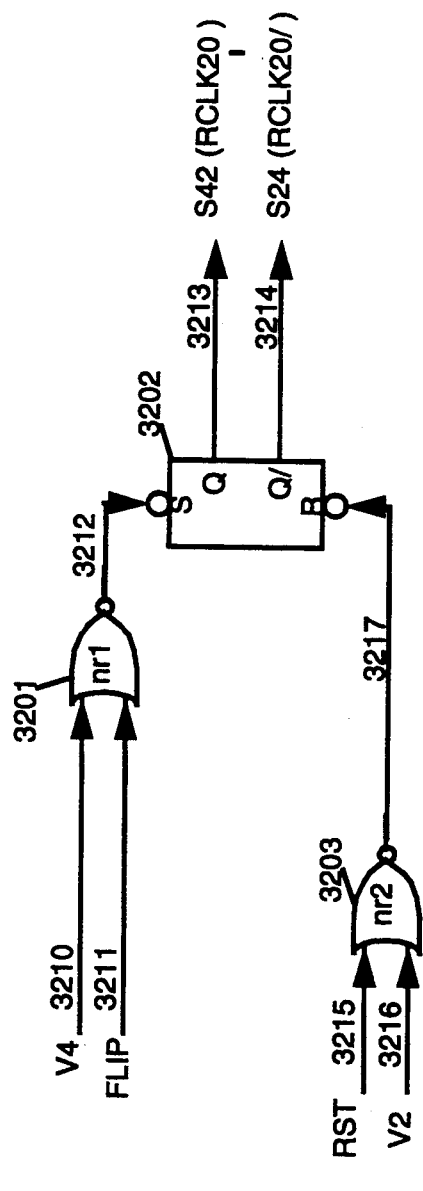
FIG. 32 illustrates the 20 MHz clock recovery circuitry generate RCLK20.

The recovered 20 MHz clock, RCLK20, is generated by the apparatus illustrated in FIG. 32. SR flip flop 3202 is set on the positive edge of clock state V4 at NOR input 3210. The flip flop is reset on the positive edge of clock state V2 at NOR input 3216. RCLK20, output 3213, goes high on the positive edge of clock state V4 and goes low on the positive edge of clock state V2 as illustrated by waveform 3506. The positive phase of the recovered 20 MHz clock, RLCK20, also represents a transition period from the positive edge of clock state V4 to the positive edge of clock state V2. We refer to this period as S42. The negative phase of the recovered 20 MHz clock, RCLK20/, is the inverse of RCLK 20. RCLK20/ represents a transition period from the positive edge of clock state V2 to the positive edge of clock state V4. We refer to this period as S24.

Accurate alignment of clock state V1 and clock state V3 with detected transitions of the encoded signal, VIX, are necessary for decoding. Thus, control of the occurrence of V1 and V3 in relation to detected transitions (VIX) is required. In the case that the positive pulse of RCLK20 is being recovered (period S42), clock state V1 will align with detected transitions. In the case that the positive pulse of RCLK20/ is being generated (period S24), clock state V3 will align with the detected transitions. Amongst other things, this assures accurate recovery and alignment of 20 MHz and 40 MHz clocks.

For example, assume the positive pulse of RCLK20 is being recovered in period S42 (S42 is logic level high). Clock state V1 is utilized to align to the detected transitions VIX. If VIX is misaligned such that it occurs earlier than the present free running clock state V1 (referred to as "early", 3508 of FIG. 35B), then VIX starts the generation of V1 earlier than normal. FIG. 28 illustrates the details of V1 clock state generator 2402. NAND 2801, delay block 2802, and NAND 2803 combine to generate the earlier-than-normal V1 clock state. The free running negative edge of clock state V4 generates a positive pulse via inverter 2807, NOR 2804, NAND 2805, delay block 2806, and NAND 2803. If VIX is "early", then NAND 2805 and delay block 2806 start generating a pulse prior to the falling edge of clock state V4. This assures that the pulse width of clock state V1 remains nearly constant. After the early V1 is generated, clock states V2, V3 and V4 are generated early as compared to the previous cycle. In other words, V1 clock state generator precludes clock state V4 from generating a second later pulse that could stretch the pulse width of clock state V1 such that the remaining clock states would be late. Thus, all four states shift in time.

In the case that VIX is misaligned such that it occurs later than the present free running clock state V1 (referred to as "late", e.g. 3507 of FIG. 35B fattens V1), then a fatter pulse 3510 of V1 is generated. This is so only if VIX pulse overlaps the free running pulse of clock state V1. Input 2835 of NAND 2801 prohibits VIX input 2821 from generating a pulse if clock state V1 is not present. To fatten clock state V1, NAND 2801 and delay block 2802 generate a precision pulse subsequent to the precision pulse generated by NAND 2805 and delay block 2806. These two pulses are merged together by NAND 2803 to create the fatter V1 pulse width. Clock states V2, V3, and V4 are shifted by the fatter V1 pulse width such that they occur later than the previous cycle.

As described above, clock state V1 can shift in time by the creation of an early pulse or by becoming a fatter pulse. In either case, clock state V1 is responding to shifts in detected transitions of the encoded waveform as compared to the free running clock states. Similar to V1, clock state V3 is aligned to transitions of VIX if the positive pulse of RCLK20/ is to be recovered. If no transition occurs during the period of the positive pulse of RCLK20/, then V3 is generated in the free running manner described above. If a transition does occur within the normal occurrence of V3, then clock state V3 is generated early or fattened in response to the detected transition VIX.

If a transition is too far from the normal V1 or V3 pulse, alignment does not occur. In order to cause the alignment procedure, detected transition VIX must nearly overlap to start the "early" pulse. In the case of generating a fattened pulse, VIX must overlap clock state V1 or V3. Generation of early pulses causes the clock states V1 and V4 to overlap as well as V3 and V2. This is an exception to the nonoverlapping clock states. S42 and S24 control which state (V1 or V3) is to occur in response to detection of transitions. There is a possibility that V3 is generated when V1 should be generated. and. V1 is generated instead of V3, in which case RCLK20 is out of phase. Correction requires "flipping" the phase relationships of RCLK20 with RCLK20/.

Figure 31:
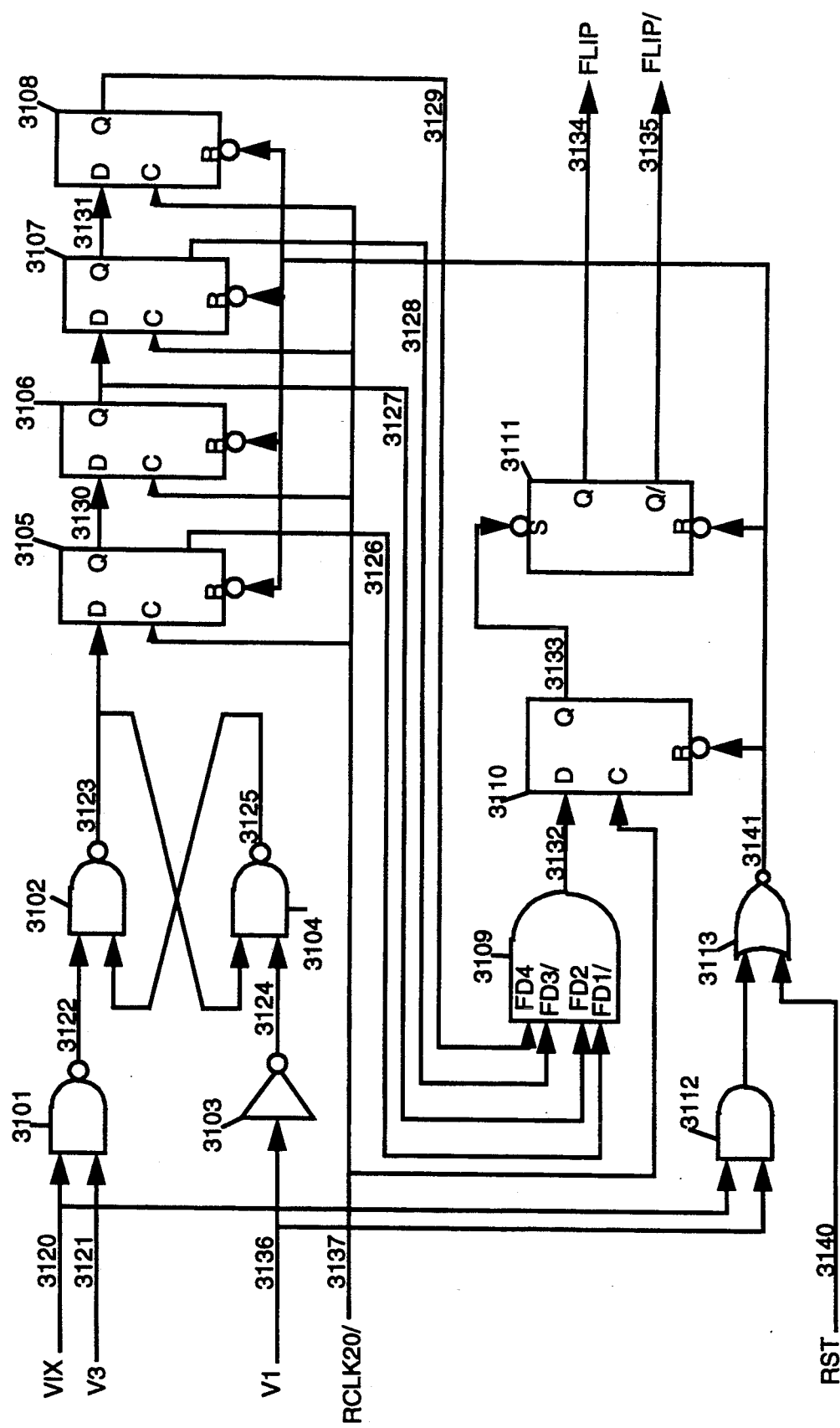
FIG. 31 illustrates the flip circuitry required to select the proper phase relationships for the recovered clocks.

Flip block 2407 flips the phase relationship of the recovered 20 MHz clock and resets the clock state generators to start from clock state V1. The out of phase condition is detected during the decoding of the 64 bit preamble. In this case the polarity of recovered 20 MHz clock is misaligned with the phase of the preamble. Proper decoding of the preamble occurs on clock state V1. Improper decoding of the preamble occurs on the clock state V3. In the case where improper decoding occurs, clock state V3 decodes a 0101 binary pattern from the preamble. Clock state V1 detects all zeros because it does not align with the transitioning edges of the encoded preamble. Thus the generation of V1 and V3 must be swapped and the phase of RCLK 20 flipped. FIG. 31 illustrates the detailed circuitry of flip block 2407. The 0101 binary pattern is selected to detect the out of phase condition that is stored in D flip flops 3108, 3107, 3106, and 3105 respectively. NAND 3101, NAND 3102, NAND 3104, and inverter 3103 are connected such that the detected transition VIX, input signal 3120, is latched in the SR flip flop (3102 and 3104) during clock state V3 (3121). The SR flip flop is reset during clock state V1 at inverter input 3136. The out of phase pattern is shifted into D flip flops 3105, 3106, 3107, 3108 utilizing the "present" positive phase of the 20 MHz clock, RLCK20. Assuming the 0101 pattern occurs, AND 3109 transitions low at output 3132. Output 3132 is passed to D flip flop 3110 that provides one addition period of delay in order to flip the phase relationship of RCLK20 and RCLK20/. Once D flip flop output 3133 transitions low, SR flip flop 3111 is set such that flip control signal 3134 transitions high. Once flip control signal transitions, clock state V2 and V4 are cleared and clock state V1 or V3 is triggered. This starts the free running clock states to be generated with the correct phase relationship. Flip control signal is sent to the 20 MHz clock regenerator 2406 as input 3211 of FIG. 32. When flip control signal goes high it sets SR flip flop 3202. RCLK20, output 3213, transitions high and is sent to V1 clock state generator 2402. This RCLK20 transition, input to NAND 2801 as input signal 2822, starts the generation of clock state V1. This causes the clock states to be generated in a free running manner.

Once the clock generation circuitry is in phase, detected transitions align with clock state V1 and reset SR flip flop 3111 via AND 3112 and NOR 3113. VIX, input 3120, when coincident with clock state V1, causes NOR output 3141 to go low, thus resetting SR flip flop 3111. This allows the 20 MHz clock to continue to be generated by SR flip flop 3202 of FIG. 32.

In this description of the clock recovery circuit, positive clock pulse states were utilized. Those skilled in the art will recognize that negative pulses to represent the clock states could have been utilized, which would require minimal changes to the described circuitry. Furthermore, those skilled in the art will recognize that differing clock state pulses can generate various frequencies of recovered clocks. Nominal clock frequencies of 20 MHz and 40 MHz represent the preferred embodiment when utilized for a 10 MHz IEEE 802.3 LAN. Other frequencies (2x and 4x) can be generated to respond to a different bandwidth frequency.

DATA DECODER

The data decoder first needs to determine when there are transitions within the incoming waveform. The circuitry of FIG. 26 illustrates a transition detector which may also be referred to as an edge detector. The transition detector generates a pulse of short duration for every transition of the encoded waveform and is referred to as a transition detected signal, VIX. Details of its operation were described above in the description of clock recovery.

Encoded data is first preliminarily decoded without concern for the compensation added due to an accumulation in DC offset. Predecoder 2408, transition detector 2401, and clock state generation circuitry of FIG. 24 accomplish this task. In the case that VIX (2412) and V1 (2414) overlap, decoded data is a logical one. NAND 2501 outputs a zero to set output 2513 of the flip flop constructed from NAND gates 2502 and 2505. (One skilled in the art will recognize that the DT decoding logic varies if a different DT encoding logic is selected.) This is indicative of a transition occurring coincidental with the falling edge of a 20 MHz clock. D flip flop 2503 synchronizes the decoding of a logical one with the (negative phase) recovered 20 MHz clock 2518 outputting a preliminary decoded data stream 2515. Clock state V3 clears the flip flop (2502 and 2505) in order to decode the next transition, if any, that occurs coincidentally with clock state V1 (2511 and 2414). In the case there is no transition detected, VIX remains low indicating a logical zero. Zero is the default state of the decoder. A transition must be detected in order to decode a logical one. FIGS. 35A–35J illustrate timing relationships between the recovered clock signals and preliminary decoded data. Next the preliminary decoded data stream must be corrected for any DC offset compensation added by the encoder.

OFFSET REPLACEMENT DECODING

In general, offset replacement decoding detects a 5 or 6 transition pattern of zeroes or ones within the encoded DT pattern and then corrects the predecoded data. In the case that DT encoded data is compensated for the DC offset by converting a 2-3 or 2-4 transition pattern into a 5 or 6, a transition from high to low or low to high is removed. The removal of a transition represents the removal of a logical one from the un-encoded NRZ waveform with one exception. The exception occurs for an NRZ pattern of 001 when DT encoding generates a 2-3 transition pattern. In the case of the exception if replacement occurs it does not represent the removal of a logical one from the NRZ waveform. The transition for the exception pattern does not align with the falling edge of the clock. The predecoded output is the original binary NRZ pattern 001. This does not require correction for any DC offset replacement encoding. For the normal 5 and 6 transition patterns correcting the DC offset replacement merely requires "adding a one" to the predecoded data pattern.

Of course this must occur at the correct time in the predecoded waveform. "Adding a one" is equivalent to recreating the original 2-3 or 2-4 transition pattern in the encoded waveform. Decoding the offset operates on a predecoded data stream. Because DT encoding encodes using state transitions, the polarity of the waveform is not important. The predecoded data stream detects transitions to be logical ones and the absence of transitions to be zeroes. Because transitions are detected, the inversion process utilized in compensating the DC offset of the encoded waveform does not affect offset replacement decoding.

The longest transition pattern of DT encoded data is 4 half bits. Five (5) and 6 transition patterns within an encoded bit stream is a sure indication that DC offset compensation was introduced in the DT encoder. Therefore detecting a minimum of five half bits between transitions in the compensated encoded waveform indicates that an offset replacement was performed.

Figure 34:
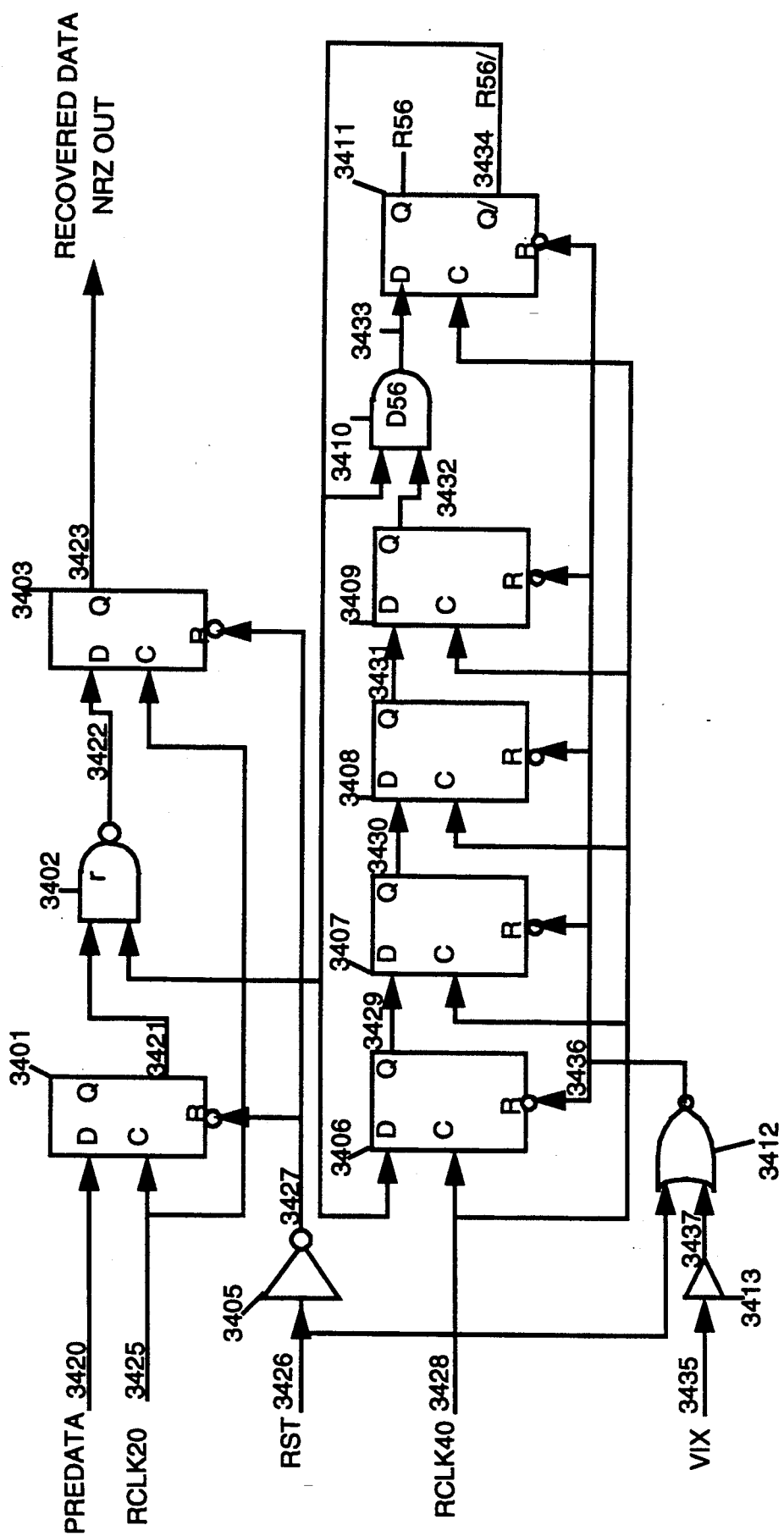
FIG. 34 illustrates the replacement decoder apparatus.
Figure 35:
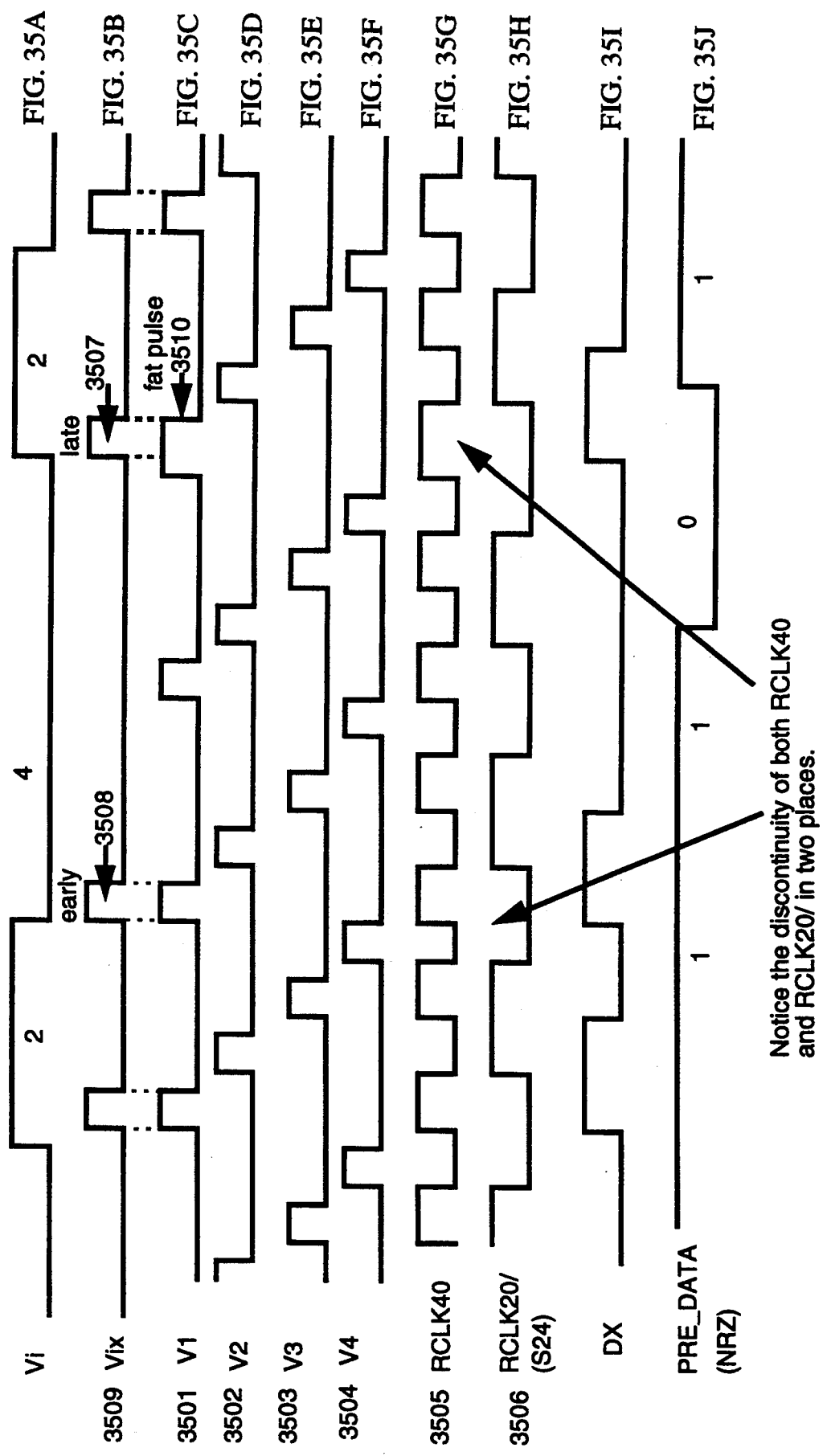
FIGS. 35A–35J illustrates the relation between generated clock states V1, V2, V3, and V4 and recovered clocks RCLK20 and RCLK40.

FIG. 34 illustrates the detailed circuitry of offset replacement decoder 2302 of FIG. 23 that accomplishes the foregoing. Replacement detection is accomplished by looking for a period of five half bits in the encoded pattern. A barrel shifter that consists of D flip flops 3406, 3407, 3408, 3409, and 3411 detects a period of five half bits. During power up reset, all flip flops are cleared. Upon reset or a transition, the barrel shifter flip flops are cleared and a seed value is started at the first D flip flop 3406 of the shift chain. In the case that no transition occurs after four periods of the positive phase 40 MHz clock (RCLK40), output 3433 of AND 3410 goes high. If no transition occurs on the fifth consecutive period of RCLK40 (3428), then the shifted seed value causes output 3434 (referred to as R56/) to go from high to low. This indicates that a pattern of at least five half bits is detected. If a transition does occur on the received undecoded data, then the barrel shifter is reset to start a shifting cycle from the first D flip flop 3406.

"Adding a one" is accomplished by NAND 3402 in FIG. 34. When R56/3434 goes low, NAND output 3422 goes high thereby "adding a one" to the predecoded waveform. The period of "adding a one" is controlled by AND 3410 and D flip flop 3411. This creates a pulse the width of RCLK40. As R56/ goes low, output 3433 of AND 3410 goes low. Output 3433 is clocked into D flip flop 3411 on the rising edge of RCLCK40 causing output 3434 to go high. When R56/ goes high it terminates the "adding of a one" via NAND 3402. In the case of a 5 transition pattern, delay element 3413 keeps the ending transition from prematurely resetting the barrel shifter and interfering with "adding a one".

The process of "adding a one" must be correctly synchronized with the predecoded waveform in order handle the exception NRZ pattern 001. The predecoded waveform is delayed by D flip flop 3401, D flip flop 2503, and the SR flip flop (2502 and 2505). Jointly these delay the detected transition by 2.5 periods of RCLK40. The "adding a one" process starts after five periods of RCLK40. "Adding a one" starts 2.5 RCLK40 periods later in order to allow the 2 half bits of the 2-3 transition period to properly synchronize with RCLK20. "Adding a one" must occur prior to the rising edge of RCLK20 in order to be captured in D flip flop 3403. In the case of the exception pattern, R56/ occurs prior to the negative edge of RCLK20 such that "adding a one" is not captured by D flip flop 3403. The exception NRZ pattern 001 is thought of having an initial transition on the rising edge of the recovered 20 MHz clock. This causes R56/ to occur around the negative edge of RCLK20. In the case that "adding a one" occurs, the initial transition is coincident with the failing edge of RCLK20 such that one RCLK20 period later a bit of one is added to the decoded waveform. Conceptually a transition is replaced between the 2-3 transition pattern of the DT encoded waveform. This "adding a one" step finalizes the decoding and correction required to properly decode a compensated DT encoded waveform.

While the offset replacement decoding apparatus is specifically designed to support a Manchester pre-encoding means, those skilled in the art will recognize that an apparatus for accomplishing DT encoding and decoding with DC offset compensation can be realized using other pre-encoding means such as Biphase-Level.

Biphase-Level is the inverted waveform of Manchester encoding. Therefore, to decode Biphase-Level pre-encoded DT waveforms, a logical zero is decoded when the positive edge of the recovered clock (RCLK) aligns with a transition. In the case that there is no transition aligned with the recovered clock a logical one is decoded.

Figure 25:
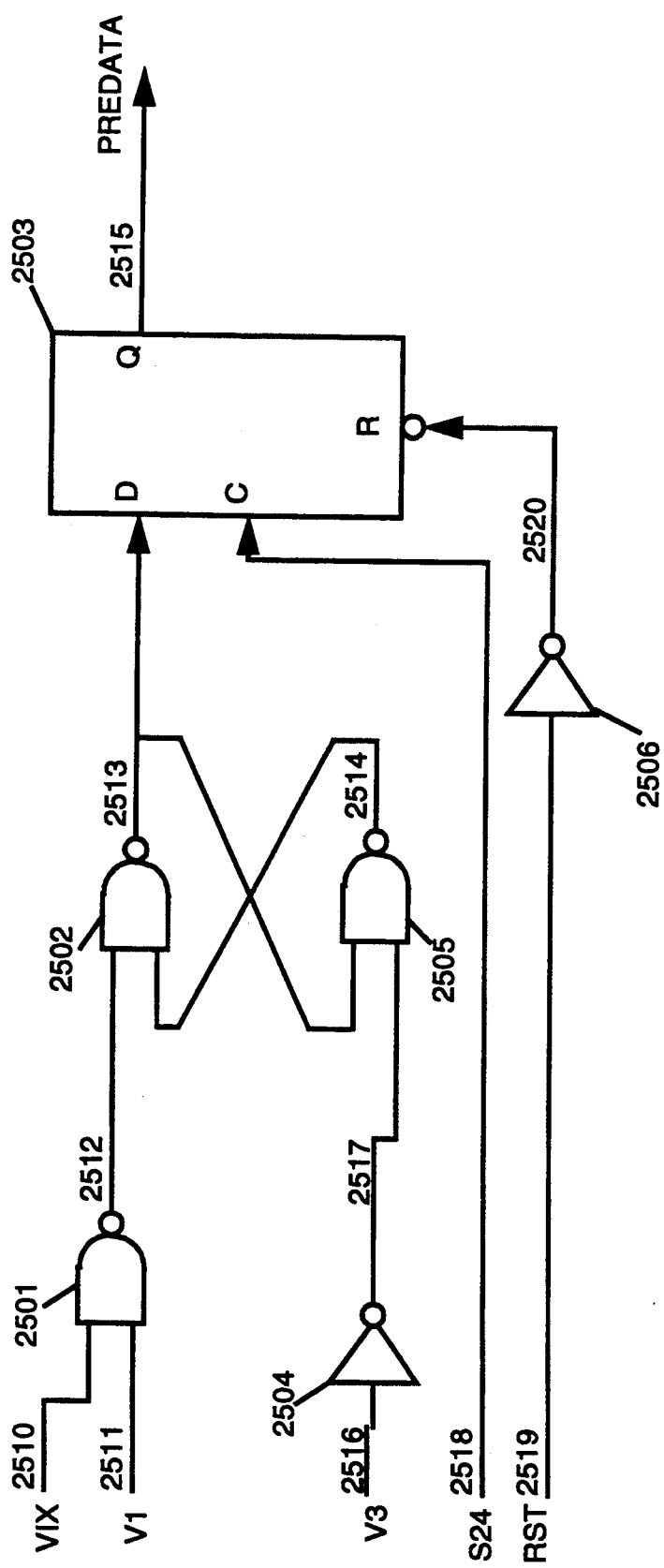
FIG. 25 illustrates the preliminary decoding apparatus to convert a DT encoded data stream into an NRZ data stream.

FIG. 25 can be modified so that DT encoded signals pre-encoded with Biphase-Level pre-encoding can be decoded. Exchange signals V1 2511 and V3 2516 such that V1 is connected to the input of inverter 2504 and V3 is connected to the input of the NAND 2501. The flip circuit of FIG. 31 must also be modified to work with Biphase-Level pre-encoding. Again signals V1 and V3 are exchanged such that V1 3136 is connected to the input of NAND 3101 and the input of AND 3112, and V3 3121 is connect to the input of the inverter 3103. Furthermore, the replacement decoding as explained in the section "Offset Replacement Decoding" is modified from "adding a one" to "adding a zero". This is accomplished by changing NAND 3402 of FIG. 34 into an AND gate. These modifications to the method and apparatus allow the DT decoder to decode DT encoded signals that have been pre-encoded by Biphase-Level.

OTHER DT DECODING METHODS

Figure 36:
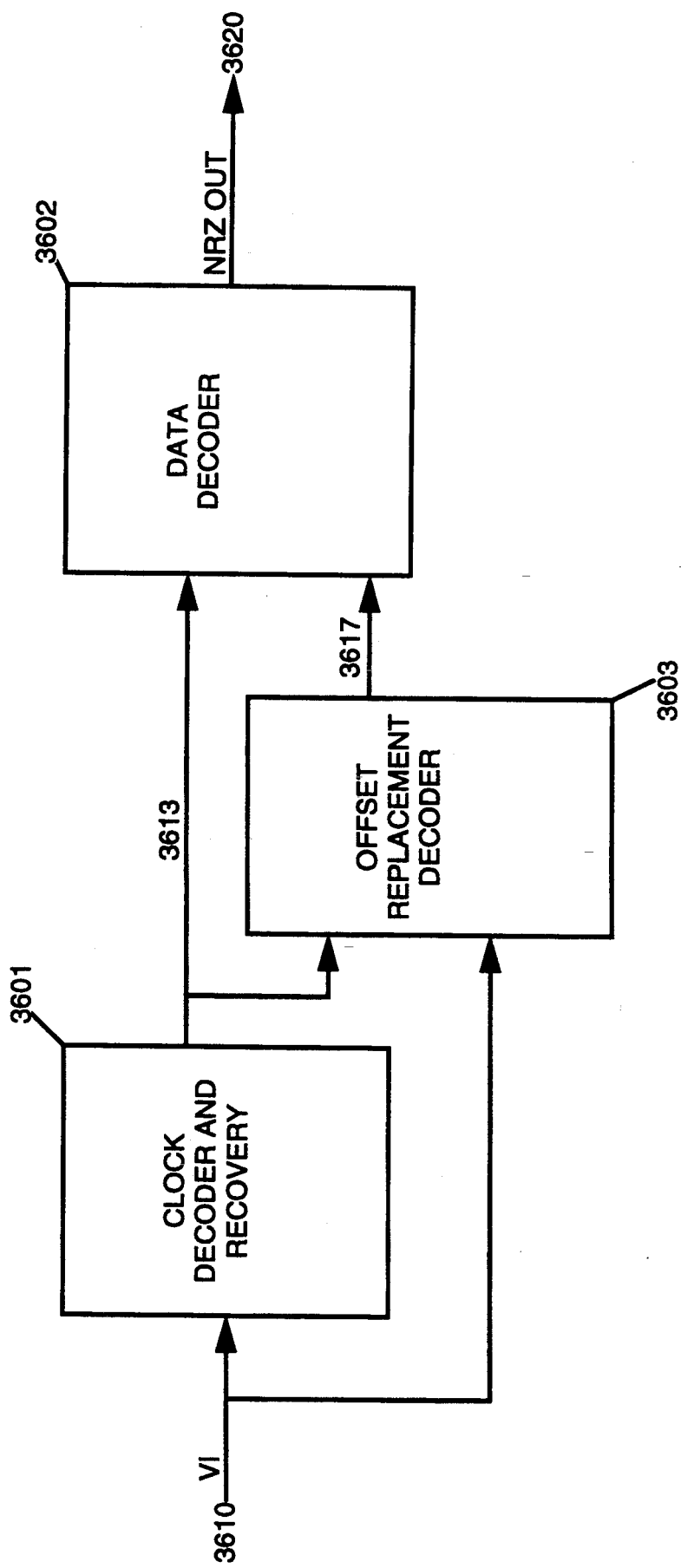
FIG. 36 illustrates the basic structure of the DT receiver/decoding system to receive a DT encoded waveform pre-encoded by FM1, FM0, and other means.

A DT encoder that uses FM1, FM0, Differential Biphase-Level, or Differential Manchester as the pre-encoding means requires a different method and apparatus for decoding the respective DT encoded signal than is described above. In these cases, it is necessary that offset replacement decoding precede the decoding of data as shown in FIG. 36. Transition patterns in the DT encoded waveform are decoded into the NRZ data stream. Offset replacement decoder 3603 searches for substituted transition patterns of 5H and 6H within DT encoded waveform 3610. Offset replacement decoder 3603 corrects the detected 5H and 6H pattern into the proper 2H-3H or 2H-4H transition pattern by performing an inversion on DT encoded waveform 3610 after the first 2 half bit periods of the 5H or 6H pattern. This generates a corrected DT encoded waveform 3617 that is input into data decoder 3602. Data decoder 3602 searches the corrected DT encoded waveform and detects transition patterns of 2H, 3H, and 4H having the leading edge either synchronized with the rising edge of the recovered clock (RCLK) or synchronized with the falling edge of RCLK.

With these different pre-encoding means, the clock decoder and recovery circuit 3601 requires slight modifications from the clock recovery circuits described previously. Because transition patterns are used to decode, it is imperative that RCLK correctly synchronize with the DT encoded waveform. This requires a series of 4H transition patterns within the DT encoded waveform which may be part of a preamble signal. We shall refer the NRZ bits required to generate these synchronizing 4H transition patterns as sync bits. FM1 and Differential Manchester require a sequence of zeroes as sync bits to generate the 4H transition pattern within the DT encoded waveform. FM0 and Differential-Biphase-Level require a sequence of ones as the sync bits to generate 4H transition patterns within the DT encoded waveform. The sync bits allow the rising edge of RCLK to align with the leading edge of the 4H transition pattern within the DT encoded waveform.

Having the RCLK correctly synchronized with the 4H transition pattern, the following definitions make it possible to define the decoding scheme for each DT encoded waveform that is encoded by a different pre-encoding method and apparatus. As illustrated in FIGS. 37A-37C, let Rsync2 3705 and Rsync3 3706 represent the 2H and 3H transition patterns having a leading edge that synchronizes with the rising edge of RCLK. Let Fsync2 3709 and Fsync3 3707 respectively represent 2H and 3H transition patterns having a leading edge that synchronizes with the falling edge of RCLK. Recall that initially, possibly during the preamble, clock decoder and recovery circuit 3601 uses a series of 4H patterns to synchronize and lock the rising edge of RCLK 3701 to the leading edge of the 4H transition patterns 3710 as shown in FIG. 37B. Let Rsync4 represent 4H transition patterns having a leading edge that aligns with the rising edge of RCLK. Thus Rsync4 patterns, because of the characteristics of the DT encoded waveform, always align with the rising edge of RCLK. In this case there is no Fsync4 that would be defined as a 4H transition pattern having a leading edge aligned with the falling edge of RCLK.

An example waveform is shown in FIG. 37C of DT decoding performed by the apparatus of FIG. 36 operating on a DT encoded waveform pre-encoded by FM1 (also known as Biphase-Mark). Data decoder 3602 operates by decoding the corrected DT encoded waveform 3702 as follows:

1) A detected Rsync4 transition pattern 3710 decodes into two zero bits (as shown by the first two NRZ values of 3703) of decoded NRZ data stream 3704.

2) A detected Rsync2 transition pattern 3705 decodes into a single one bit of the NRZ data stream.

3) A detected Rsync3 transition pattern 3706 decodes into a zero bit and a one bit of the NRZ data stream.

4) A detected Fsync2 transition pattern 3709 decodes into a one bit of the NRZ data stream 5) A detected Fsync3 transition pattern 3707 decodes into a zero bit of the NRZ data stream.

The detected transition patterns above, such as Rsync4, decode for half bit periods that are either all one bits 3710 or zero bits 3711. Each of these NRZ data bits is decoded on the falling edge of RCLK. Useful characteristics of the transition patterns within the DT encoded waveform that can be used to aid in error checking and decoding are as follows: An Rsync2 never immediately follows an Rsync3 or an Fsync2. An Fsync2 never immediately follows an Fsync3, or an Rsync2, or an Rsync4 transition pattern. There is always an even number of 3H transition patterns between two Rsync4 transition patterns.

For DT decoding where the DT encoded waveform is pre-encoded by FM0 the decoded bits can be thought of being inverted relative to the DT decoding for an FM1 pre-encoding described above. In this case the corrected DT encoded waveform decodes as follows:

1) A detected Rsync4 transition pattern decodes into two logical one bits of the NRZ data stream.

2) A detected Rsync2 transition pattern decodes into a single zero bit of the NRZ data stream.

3) A detected Rsync3 transition pattern decodes into a one bit and a zero bit of the NRZ data stream.

4) A detected Fsync2 transition pattern decodes into a zero bit of the NRZ data stream.

5) A detected Fsync3 transition pattern decodes into a one bit of the NRZ data stream.

Each NRZ data bit is decoded on the falling edge of RCLK and have similar characteristics to the DT decoding for an FM1 pre-encoded DT encoded waveform.

Those skilled in the art will recognize that the chosen edge of RCLK to align with the transition patterns could be swapped to be the negative edge. Those skilled will also recognize that the lagging edge of the defined transition patterns could be used instead of the leading edge to align appropriately to RCLK.

While the decoding method and apparatus is described by supporting an FM1 and FM0 pre-encoding means, those skilled in the art will recognize that an apparatus for accomplishing DT encoding and decoding with DC offset compensation can be realized using other pre-encoding means. DT decoding a Differential Biphase-Level pre-encoded DT encoded signal requires the same decoding method as that of FM0. A Differential Biphase-Level encoded waveform is shifted one half a period from that of an FM0 encoded waveform. DT decoding a Differential Manchester pre-encoded DT encoded signal requires the same decoding method as that of FM1. A Differential Manchester encoded waveform is shifted one half a period from that of an FM1 encoded waveform.

DT COEXISTANCE/SYSTEM INTERFACE

For local area networks it is desirable to upgrade systems over a period of time without disturbing present users. If a new encoding/decoding method is added to an existing system, it must not interfere with the present transmission of data. This requires distinguishing data encoded using the new method from data encoded using the present method. DT encoding can coexist with a normal Ethernet local area network utilizing Manchester encoding/decoding. This is so regardless of whether the transmission media is coaxial, unshielded twisted pair, or shielded twisted pair. Detection of a DT encoded signal can be accomplished by use of the last preamble bits.

Early developers of the Ethernet and IEEE 802.3 foresaw the possibility that there could be different forms of encoding that would provide higher bit rates. Specifications within the IEEE 802.3 standard allow for different methods of encoding. Key to differentiating a DT encoded waveform from a "normal" or Manchester encoded Ethernet waveform is the last byte of the IEEE 802.3 preamble.

Normally an Ethernet frame has a 1 - 1 pattern as the last two bits for the last byte of the preamble. Circuits designed to meet IEEE 802.3 detect the last byte of the preamble to be 10101011. If this byte is not detected, a standard IEEE 802.3 receiver circuit does not accept the received frame. Thus alternate encoding methods such as Double Toggle can alter the last byte of the preamble to provide a means for detection. The last two bits of the preamble can be altered from 11 to 00 to provide distinction between an alternate encoding means and the IEEE 802.3 standard, Manchester. The new encoding method can alter the last bits and the new decoder can detect the last byte of the preamble to be 01010100. To differentiate DT encoding from Manchester encoding, the preamble of a DT frame should conclude with the byte 01010100.

It may appear that a polarity reversal in the wires causes the last byte in the preamble to look incorrect and create confusion in detecting a new encoding method. This is not so. The standard IEEE 802.3 method to detect polarity reversals utilizes the last transition in the frame. In the case of proper polarity the final transition to zero is detected to occur from positive to zero DC volts. In the case that the wiring is reversed causing a reversed polarity, the final transition detected would occur from negative to zero DC volts. For the proposed modified byte the correct polarity is still indicated by the final transition occurring from positive to zero DC. Thus the polarity reversal can still be detected. However as explained above, DT encoding is not effected by wiring reversals.

Therefore, for the reasons stated above, it is recommended that DT encoding for Ethernet and IEEE 802.3 LANs utilize 01010100 as the final byte of the preamble. Thus, we have shown that stations or nodes using normal Ethernet Manchester encoding can coexist on the same network as stations utilizing DT encoding.

Thus, while the preferred and alternate embodiments of the present invention have been disclosed and described herein, it will be obvious to those skilled in the art that various changes in form and detail may be made therein without departing from the spirit and scope of the invention.

I claim:

1. A clock recovery apparatus to output a recovered clock from a serial signal containing both clock information and data information, comprising:

transition detector means to detect transitions in said serial signal and to generate a transition-detected signal responsive to said transitions;

first odd clock state generator means, including a first and a second precision delay means, and being responsive to said transition-detected signal and to a clock-state-four signal, to generate a clock-state-one signal that, in the absence of said transitions, is held active by said first precision delay means for a predetermined duration starting immediately after said clock-state-four signal;

first even clock state generator means, including a third precision delay means, and being responsive to said clock-state-one signal, to generate a clock-state-two signal that is held active by said third precision delay means for said predetermined duration starting immediately after said clock-state-one signal;

second odd clock state generator means, including a fourth and a fifth precision delay means, and being responsive to said transition-detected signal and to said clock-state-two signal, to generate a clock-state-three signal that, in the absence of said transitions, is held active by said fourth precision delay means for said predetermined period starting immediately after said clock-state-two signal;

second even clock state generator means, including a sixth precision delay means, and being responsive to said clock-state-three signal, to generate said clock-state-four signal that is held active by said sixth precision delay means for said predetermined duration starting immediately after said clock-state-three signal;

recovered clock output means to generate and to output said recovered clock responsive to one or more of said clock-state-one, clock-state-two, clock-state-three, and clock-state-four signals;

said second precision delay means, operating when said transition-detected signal occurs close to the start of said clock-state-one signal, to hold said clock-state-one signal active for said predetermined duration after said occurrence of said transition-detected signal, notwithstanding the operation of said first precision delay, such that when said transition-detected signal occurs during said clock-state-one signal then the duration of said clock-state-one signal is lengthened so as to correspond to the phase of said serial signal and when said transition-detected signal occurs prior to the start of said clock-state-one signal then said clock-state-one signal is immediately started so as to correspond to the phase of said serial signal;

said fifth precision delay means, operating when said transition-detected signal occurs close to the start of said clock-state-three signal, to hold said clock-state-three signal active for said predetermined duration after said occurrence of said transition-detected signal, notwithstanding the operation of said fourth precision delay, such that when said transition-detected signal occurs during said clock-state-three signal then the duration of said clock-state-three signal is lengthened so as to correspond to the phase of said serial signal and when said transition-detected signal occurs prior to the start of said clock-state-three signal then said clock-state-three signal is immediately started so as to correspond to the phase of said serial signal.

2. A clock recovery apparatus to output a recovered clock from a serial signal containing both clock information and data information and beginning with a predetermined phase-sensitive preamble, comprising:

transition detector means to detect transitions in said serial signal and to generate a transition-detected signal responsive to said transitions;

first odd clock state generator means, including a first and a second precision delay means, and being responsive to said transition-detected signal and to a clock-state-four signal, to generate a clock-state-one signal that, in the absence of said transitions, is held active by said first precision delay means for a predetermined duration starting immediately after said clock-state-four signal;

first even clock state generator means, including a third precision delay means, and being responsive to said clock-state-one signal, to generate a clock-state-two signal that is held active by said third precision delay means for said predetermined duration starting immediately after said clock-state-one signal;

second odd clock state generator means, including a fourth and a fifth precision delay means, and being responsive to said transition-detected signal and to said clock-state-two signal, to generate a clock-state-three signal that, in the absence of said transitions, is held active by said fourth precision delay means for said predetermined period starting immediately after said clock-state-two signal;

second even clock state generator means, including a sixth precision delay means, and being responsive to said clock-state-three signal, to generate said clock-state-four signal that is held active by said sixth precision delay means for said predetermined duration starting immediately after said clock-state-three signal;

recovered clock output means to generate and to output said recovered clock responsive to one or more of said clock-state-one, clock-state-two, clock-state-three, and clock-state-four signals;

said second precision delay means, operating when said transition-detected signal occurs close to the start of said clock-state-one signal, to hold said clock-state-one signal active for said predetermined duration after said occurrence of said transition-detected signal, notwithstanding the operation of said first precision delay, such that when said transition-detected signal occurs during said clock-state-one signal then the duration of said clock-state-one signal is lengthened so as to correspond to the phase of said serial signal and when said transition-detected signal occurs prior to the start of said clock-state-one signal then said clock-state-one signal is immediately started so as to correspond to the phase of said serial signal;

said fifth precision delay means, operating when said transition-detected signal occurs close to the start of said clock-state-three signal, to hold said clock-state-three signal active for said predetermined duration after said occurrence of said transition-detected signal, notwithstanding the operation of said fourth precision delay, such that when said transition-detected signal occurs during said clock-state-three signal then the duration of said clock-state-three signal is lengthened so as to correspond to the phase of said serial signal and when said transition-detected signal occurs prior to the start of said clock-state-three signal then said clock-state-three signal is immediately started so as to correspond to the phase of said serial signal;

a polarity flipping means to flip the polarity of said recovered clock responsive to misalignment between the occurrence of said predetermined phase-sensitive preamble and the polarity of said recovered clock, wherein said misalignment is detected when either said clock-state-one or said clock-state-three decodes a predetermined binary pattern from said preamble.

3. A clock recovery apparatus to output a recovered clock from a serial signal containing both clock and data information and beginning with a predetermined phase-sensitive preamble, comprising:

transition detector means to detect transitions in said serial signal and to generate a transition-detected signal responsive to said transitions;

first odd clock state generator means, including a first and a second precision delay means, and being responsive to said transition-detected signal, to a flip signal, and to a clock-state-four signal, to generate a clock-state-one signal that, in the absence of said transitions, is held active by said first precision delay means for a predetermined duration starting immediately after said clock-state-four signal;

first even clock state generator means, including a third precision delay means, and being responsive to said clock-state-one signal, to generate a clock-state-two signal that is held active by said third precision delay means for said predetermined duration starting immediately after said clock-state-one signal;

second odd clock state generator means, including a fourth and a fifth precision delay means, and being responsive to said transition-detected signal, to said flip signal, and to said clock-state-two signal, to generate a clock-state-three signal that, in the absence of said transitions, is held active by said fourth precision delay means for said predetermined period starting immediately after said clock-state-two signal;

second even clock state generator means, including a sixth precision delay means, and being responsive to said clock-state-three signal, to generate said clock-state-four signal that is held active by said sixth precision delay means for said predetermined duration starting immediately after said clock-state-three signal;

recovered clock output means to generate and to output said recovered clock responsive to one or more of said flip, clock-state-one, clock-state-two, clock-state-three, and clock-state-four signals;

said second precision delay means, operating when said transition-detected signal occurs close to the start of said clock-state-one signal, to hold said clock-state-one signal active for said predetermined duration after said occurrence of said transition-detected signal, notwithstanding the operation of said first precision delay, such that when said transition-detected signal occurs during said clock-state-one signal then the duration of said clock-state-one signal is lengthened so as to correspond to the phase of said serial signal and when said transition-detected signal occurs prior to the start of said clock-state-one signal then said clock-state-one signal is immediately started so as to correspond to the phase of said serial signal;

said fifth precision delay means, operating when said transition-detected signal occurs close to the start of said clock-state-three signal, to hold said clock-state-three signal active for said predetermined duration after said occurrence of said transition-detected signal, notwithstanding the operation of said fourth precision delay, such that when said transition-detected signal occurs during said clock-state-three signal then the duration of said clock-state-three signal is lengthened so as to correspond to the phase of said serial signal and when said transition-detected signal occurs prior to the start of said clock-state-three signal then said clock-state-three signal is immediately started so as to correspond to the phase of said serial signal;

a polarity flipping means to flip the polarity of said recovered clock and to generate said flip signal, responsive to misalignment between the occurrence of said predetermined phase-sensitive preamble and the polarity of said recovered clock, wherein said misalignment is detected when either said clock-state-one or said clock-state-three decodes a predetermined binary pattern from said preamble, said first odd clock state generator means, said second odd clock state generator means, and said recovered clock output means responsive to the occurrence of said flip signal so as to invert the polarity of said recovered clock.

4. An apparatus for decoding a non-return-to-zero (NRZ) data stream from a serial signal, beginning with a predetermined phase-sensitive preamble, comprising:

transition detector means to detect transitions in said serial signal and to generate a transition-detected signal responsive to said transitions;

first odd clock state generator means, including a first and a second precision delay means, and being responsive to said transition-detected signal and to a clock-state-four signal, to generate a clock-state-one signal that, in the absence of said transitions, is held active by said first precision delay means for a predetermined duration starting immediately after said clock-state-four signal;

first even clock state generator means, including a third precision delay means, and being responsive to said clock-state-one signal, to generate a clock-state-two signal that is held active by said third precision delay means for said predetermined duration starting immediately after said clock-state-one signal;

second odd clock state generator means, including a fourth and a fifth precision delay means, and being responsive to said transition-detected signal and to said clock-state-two signal, to generate a clock-state-three signal that, in the absence of said transitions, is held active by said fourth precision delay means for said predetermined period starting immediately after said clock-state-two signal;

second even clock state generator means, including a sixth precision delay means, and being responsive to said clock-state-three signal, to generate said clock-state-four signal that is held active by said sixth precision delay means for said predetermined duration starting immediately after said clock-state-three signal;

recovered clock output means to generate and to output said recovered clock, having a half bit period and indicating the timing of transitions within said serial signal, responsive to one or more of said clock-state-one, clock-state-two, clock-state-three, and clock-state-four signals;

said second precision delay means, operating when said transition-detected signal occurs close to the start of said clock-state-one signal, to hold said clock-state-one signal active for said predetermined duration after said occurrence of said transition-detected signal, notwithstanding the operation of said first precision delay, such that when said transition-detected signal occurs during said clock-state-one signal then the duration of said clock-state-one signal is lengthened so as to correspond to the phase of said serial signal and when said transition-detected signal occurs prior to the start of said clock-state-one signal then said clock-state-one signal is immediately started so as to correspond to the phase of said serial signal;

said fifth precision delay means, operating when said transition-detected signal occurs close to the start of said clock-state-three signal, to hold said clock-state-three signal active for said predetermined duration after said occurrence of said transition-detected signal, notwithstanding the operation of said fourth precision delay, such that when said transition-detected signal occurs during said clock-state-three signal then the duration of said clockstate-three signal is lengthened so as to correspond to the phase of said serial signal and when said transition-detected signal occurs prior to the start of said clock-state-three signal then said clock-state-three signal is immediately started so as to correspond to the phase of said serial signal;

a polarity flipping means to flip the polarity of said recovered clock responsive to misalignment between the occurrence of said predetermined phase-sensitive preamble and the polarity of said recovered clock, wherein said misalignment is detected when either said clock-state-one or said clock-state-three decodes a predetermined binary pattern from said preamble;

pre-decoder means to generate a preliminary decoded data stream responsive to said serial signal and to said recovered clock;

offset replacement decoder means, coupled to said recovered clock output means and said predecoder means, responsive to said preliminary decoded data stream, said serial signal, and said recovered clock, to generate said NRZ data stream from said preliminary decoded data stream by detecting predetermined substituted transition patterns within said serial signal by detecting a predetermined sequential number of half bit periods with no transition and, when detected, correcting said preliminary decoded data stream to produce said NRZ data stream.

5. An apparatus in accordance with claim 4, wherein said offset replacement decoder means detects said predetermined substituted transition patterns within said serial signal having at least five of said half bit periods of the same value and corrects said preliminary decoded data stream by changing the value of a single bit to generate said NRZ data stream.

6. An apparatus for decoding a non-return-to-zero (NRZ) data stream from a serial signal, beginning with a predetermined phase-sensitive preamble, received from a local area network, comprising:

transition detector means to detect transitions in said serial signal and to generate a transition-detected signal responsive to said transitions;

first odd clock state generator means, including a first and a second precision delay means, and being responsive to said transition-detected signal and to a clock-state-four signal, to generate a clock-state-one signal that, in the absence of said transitions, is held active by said first precision delay means for a predetermined duration starting immediately after said clock-state-four signal;

first even clock state generator means, including a third precision delay means, and being responsive to said clock-state-one signal, to generate a clock-state-two signal that is held active by said third precision delay means for said predetermined duration starting immediately after said clock-state-one signal;

second odd clock state generator means, including a fourth and a fifth precision delay means, and being responsive to said transition-detected signal and to said clock-state-two signal, to generate a clock-state-three signal that, in the absence of said transitions, is held active by said fourth precision delay means for said predetermined period starting immediately after said clock-state-two signal;

second even clock state generator means, including a sixth precision delay means, and being responsive to said clock-state-three signal, to generate said clock-state-four signal that is held active by said sixth precision delay means for said predetermined duration starting immediately after said clock-state-three signal;

recovered clock output means to generate and to output said recovered clock, having a half bit period and indicating the timing of transitions within said serial signal received from said local area network, responsive to one or more of said clock-state-one, clock-state-two, clock-state-three, and clock-state-four signals;

said second precision delay means, operating when said transition-detected signal occurs close to the start of said clock-state-one signal, to hold said clock-state-one signal active for said predetermined duration after said occurrence of said transition-detected signal, notwithstanding the operation of said first precision delay, such that when said transition-detected signal occurs during said clock-state-one signal then the duration of said clock-state-one signal is lengthened so as to correspond to the phase of said serial signal and when said transition-detected signal occurs prior to the start of said clock-state-one signal then said clock-state-one signal is immediately started so as to correspond to the phase of said serial signal;

said fifth precision delay means, operating when said transition-detected signal occurs close to the start of said clock-state-three signal, to hold said clock-state-three signal active for said predetermined duration after said occurrence of said transition-detected signal, notwithstanding the operation of said fourth precision delay, such that when said transition-detected signal occurs during said clock-state-three signal then the duration of said clock-state-three signal is lengthened so as to correspond to the phase of said serial signal and when said transition-detected signal occurs prior to the start of said clock-state-three signal then said clock-state-three signal is immediately started so as to correspond to the phase of said serial signal;

a polarity flipping means to flip the polarity of said recovered clock responsive to misalignment between the occurrence of said predetermined phase-sensitive preamble and the polarity of said recovered clock, wherein said misalignment is detected when either said clock-state-one or said clock-state-three decodes a predetermined binary pattern from said preamble;

pre-decoder means to generate a preliminary decoded data stream responsive to said serial signal and to said recovered clock;

offset replacement decoder means, coupled to said recovered clock output means and said predecoder means, responsive to said preliminary decoded data stream, said serial signal, and said recovered clock, to generate and output said NRZ data stream from said preliminary decoded data stream by detecting predetermined substituted transition patterns within said serial signal by detecting a predetermined sequential number of half bit periods with no transition and when detected, correcting said preliminary decoded data stream prior to its being output as said NRZ data stream.

7. An apparatus in accordance with claim 6, wherein said offset replacement decoder means detects said predetermined substituted transition patterns within said serial signal having at least five of said half bit periods of the same value and corrects said preliminary decoded data stream by changing the value of a single bit to generate said NRZ data stream.

8. The apparatus of any of claims 4 to 7 wherein,
said pre-decoder means decodes said serial signals encoded by a Manchester pre-encoding means,
in the case where a transition of said serial signal synchronizes with said recovered clock, said pre-decoder means generates a one within said preliminary decoded data stream, and
in the case where no transition of said serial signal synchronizes with said recovered clock, said pre-decoder means generates a zero within said preliminary decoded data stream.

9. The apparatus of any of claims 4 to 7 wherein,
said pre-decoder means decodes said serial signals encoded by a Biphase-Level pre-encoding means,
in the case where a transition of said serial signal synchronizes with said recovered clock, said pre-decoder generates a zero within said preliminary decoded data stream, and
in the case where no transition of said serial signal synchronizes with said recovered clock, said pre-decoder generates a one within said preliminary decoded data stream.

10. An apparatus for decoding a non-return-to-zero (NRZ) data stream from a serial signal, beginning with a predetermined phase-sensitive preamble, comprising:
transition detector means to detect transitions in said serial signal and to generate a transition-detected signal responsive to said transitions;
first odd clock state generator means, including a first and a second precision delay means, and being responsive to said transition-detected signal and to a clock-state-four signal, to generate a clock-state-one signal that, in the absence of said transitions, is held active by said first precision delay means for a predetermined duration starting immediately after said clock-state-four signal;
first even clock state generator means, including a third precision delay means, and being responsive to said clock-state-one signal, to generate a clock-state-two signal that is held active by said third precision delay means for said predetermined duration starting immediately after said clock-state-one signal;
second odd clock state generator means, including a fourth and a fifth precision delay means, and being responsive to said transition-detected signal and to said clock-state-two signal, to generate a clock-state-three signal that, in the absence of said transitions, is held active by said fourth precision delay means for said predetermined period starting immediately after said clock-state-two signal;
second even clock state generator means, including a sixth precision delay means, and being responsive to said clock-state-three signal, to generate said clock-state-four signal that is held active by said sixth precision delay means for said predetermined duration starting immediately after said clock-state-three signal;
recovered clock output means to generate and to output said recovered clock, having a half bit period and indicating the timing of transitions within said serial signal, responsive to one or more of said clock-state-one, clock-state-two, clock-state-three, and clock-state-four signals;
said second precision delay means, operating when said transition-detected signal occurs close to the start of said clock-state-one signal, to hold said clock-state-one signal active for said predetermined duration after said occurrence of said transition-detected signal, notwithstanding the operation of said first precision delay, such that when said transition-detected signal occurs during said clock-state-one signal then the duration of said clock-state-one signal is lengthened so as to correspond to the phase of said serial signal and when said transition-detected signal occurs prior to the start of said clock-state-one signal then said clock-state-one signal is immediately started so as to correspond to the phase of said serial signal;
said fifth precision delay means, operating when said transition-detected signal occurs close to the start of said clock-state-three signal, to hold said clock-state-three signal active for said predetermined duration after said occurrence of said transition-detected signal, notwithstanding the operation of said fourth precision delay, such that when said transition-detected signal occurs during said clock-state-three signal then the duration of said clock-state-three signal is lengthened so as to correspond to the phase of said serial signal and when said transition-detected signal occurs prior to the start of said clock-state-three signal then said clock-state-three signal is immediately started so as to correspond to the phase of said serial signal;
a polarity flipping means to flip the polarity of said recovered clock responsive to misalignment between the occurrence of said predetermined phase-sensitive preamble and the polarity of said recovered clock, wherein said misalignment is detected when either said clock-state-one or said clock-state-three decodes a predetermined binary pattern from said preamble;
offset replacement decoder means, coupled to said recovered clock output means, responsive to said serial signal and said recovered clock, to generate a corrected encoded data stream by detecting predetermined substituted transition patterns within said serial signal by detecting a predetermined sequential number of half bit periods with no transition and when detected, correcting said serial signal prior to its being output as said corrected encoded data stream;
data decoder means to generate said NRZ data stream responsive to said corrected encoded data stream and to said recovered clock.

11. An apparatus in accordance with claim 10, wherein said offset replacement decoder means detects said predetermined substituted transition patterns within said serial signal having a sequence of at least five of said half bit periods all of the same value, corrects said serial signal into said corrected encoded data stream by inverting said serial signal after the first two half bit periods within said sequence of half bit periods.

12. An apparatus for decoding a non-return-to-zero (NRZ) data stream from a serial signal, beginning with a predetermined phase-sensitive preamble, received from a local area network, comprising:
transition detector means to detect transitions in said serial signal and to generate a transition-detected signal responsive to said transitions;
first odd clock state generator means, including a first and a second precision delay means, and being responsive to said transition-detected signal and to a clock-state-four signal, to generate a clock-state-one signal that, in the absence of said transitions, is held active by said first precision delay means for a predetermined duration starting immediately after said clock-state-four signal;

first even clock state generator means, including a third precision delay means, and being responsive to said clock-state-one signal, to generate a clock-state-two signal that is held active by said third precision delay means for said predetermined duration starting immediately after said clock-state-one signal;

second odd clock state generator means, including a fourth and a fifth precision delay means, and being responsive to said transition-detected signal and to said clock-state-two signal, to generate a clock-state-three signal that, in the absence of said transitions, is held active by said fourth precision delay means for said predetermined period starting immediately after said clock-state-two signal;

second even clock state generator means, including a sixth precision delay means, and being responsive to said clock-state-three signal, to generate said clock-state-four signal that is held active by said sixth precision delay means for said predetermined duration starting immediately after said clock-state-three signal;

recovered clock output means to generate and to output said recovered clock, having a half bit period and indicating the timing of transitions within said serial signal, responsive to one or more of said clock-state-one, clock-state-two, clock-state-three, and clock-state-four signals;

said second precision delay means, operating when said transition-detected signal occurs close to the start of said clock-state-one signal, to hold said clock-state-one signal active for said predetermined duration after said occurrence of said transition-detected signal, notwithstanding the operation of said first precision delay, such that when said transition-detected signal occurs during said clock-state-one signal then the duration of said clock-state-one signal is lengthened so as to correspond to the phase of said serial signal and when said transition-detected signal occurs prior to the start of said clock-state-one signal then said clock-state-one signal is immediately started so as to correspond to the phase of said serial signal;

said fifth precision delay means, operating when said transition-detected signal occurs close to the start of said clock-state-three signal, to hold said clock-state-three signal active for said predetermined duration after said occurrence of said transition-detected signal, notwithstanding the operation of said fourth precision delay, such that when said transition-detected signal occurs during said clock-state-three signal then the duration of said clock-state-three signal is lengthened so as to correspond to the phase of said serial signal and when said transition-detected signal occurs prior to the start of said clock-state-three signal then said clock-state-three signal is immediately started so as to correspond to the phase of said serial signal;

a polarity flipping means to flip the polarity of said recovered clock responsive to misalignment between the occurrence of said predetermined phase-sensitive preamble and the polarity of said recovered clock, wherein said misalignment is detected when either said clock-state-one or said clock-state-three decodes a predetermined binary pattern from said preamble;

offset replacement decoder means, coupled to said recovered clock output means, responsive to said serial signal and said recovered clock, to generate a corrected encoded data stream by detecting predetermined substituted transition patterns within said serial signal by detecting a predetermined sequential number of half bit periods with no transition and when detected, correcting said serial signal prior to its being output as said corrected encoded data stream;

data decoder means to generate said NRZ data stream responsive to said corrected encoded data stream and to said recovered clock.

13. An apparatus in accordance with claim 12, wherein said offset replacement decoder means detects said predetermined substituted transition patterns within said serial signal having a sequence of at least five of said half bit periods all of the same value, corrects said serial signal into said corrected encoded data stream by inverting said serial signal after the first two half bit periods within said sequence of half bit periods.

14. The apparatus of any of claims 10 to 13 wherein, said data decoder means decodes said serial signals encoded by Biphase-Mark (FM1) pre-encoding means, in the case where the leading edge of a transition pattern within said corrected encoded data stream aligns with the rising edge of said recovered clock, when said transition pattern is four half bit periods all having the same value, then said data decoder means generates two zero bits within said NRZ data stream, when said transition pattern is two half bit periods all having the same value, then said data decoder means generates a single one bit within said NRZ data stream, when said transition pattern is three half bit periods all having the same value, then said data decoder means generates a zero bit followed by a one bit within said NRZ data stream;

in the case where the leading edge of a transition pattern within said corrected encoded data stream aligns with the falling edge of said recovered clock, when said transition pattern is two half bit periods all having the same value, then said data decoder means generates a single one bit within said NRZ data stream, when said transition pattern is three half bit periods all having the same value, then said data decoder means generates a single zero bit within said NRZ data stream.

15. The apparatus of any of claims 10 to 13 wherein, said data decoder means decodes said serial signals encoded by a Differential-Manchester pre-encoding means, in the case where the leading edge of a transition pattern within said corrected encoded data stream aligns with the rising edge of said recovered clock, when said transition pattern is four half bit periods all having the same value, then said data decoder means generates two zero bits within said NRZ data stream, when said transition pattern is two half bit periods all having the same value, then said data decoder means generates a single one bit within said NRZ data stream, when said transition pattern is three half bit periods all having the same value, then said data decoder means generates a zero bit followed by a one bit within said NRZ data stream;

in the case where the leading edge of a transition pattern within said corrected encoded data stream aligns with the falling edge of said recovered clock, when said transition pattern is two half bit periods all having the same value, then said data decoder means decodes it into a single one bit within said NRZ data stream, when said transition pattern is three half bit periods all having the same value, then said data decoder means generates a single zero bit within said NRZ data stream.

16. The apparatus of any of claims 10 to 13 wherein, said data decoder means decodes said serial signals encoded by a Biphase-Space (FM0) pre-encoding means, in the case where the leading edge of a transition pattern within said corrected encoded data stream aligns with the rising edge of said recovered clock, when said transition pattern is four half bit periods all having the same value, then said data decoder means generates two one bits within said NRZ data stream, when said transition pattern is two half bit periods all having the same value, then said data decoder means generates a single zero bit within said NRZ data stream, when said transition pattern is three half bit periods all having the same value, then said data decoder means generates a one bit followed by a zero bit within said NRZ data stream;

in the case where the leading edge of a transition pattern within said corrected encoded data stream aligns with the falling edge of said recovered clock, when said transition pattern is two half bit periods all having the same value, then said data decoder means generates a single zero bit within said NRZ data stream, when said transition pattern is three half bit periods all having the same value, then said data decoder means generates a single one bit within said NRZ data stream.

17. The apparatus of any of claims 10 to 13 wherein, said data decoder means decodes said serial signals encoded by a Differential-Biphase-Level pre-encoding means, in the case where the leading edge of a transition pattern within said corrected encoded data stream aligns with the rising edge of said recovered clock, when said transition pattern is four half bit periods all having the same value, then said data decoder means generates two one bits within said NRZ data stream, when said transition pattern is two half bit periods all having the same value, then said data decoder means generates a single zero bit within said NRZ data stream, when said transition pattern is three half bit periods all having the same value, then said data decoder means generates a one bit followed by a zero bit within said NRZ data stream;

in the case where the leading edge of a transition pattern within said corrected encoded data stream aligns with the falling edge of said recovered clock, when said transition pattern is two half bit periods all having the same value, then said data decoder means generates a single zero bit within said NRZ data stream, when said transition pattern is three half bit periods all having the same value, then said data decoder means generates a single one bit within said NRZ data stream.

* * * * *